United States Patent
Yoshikawa et al.

(10) Patent No.: US 9,621,139 B2
(45) Date of Patent: Apr. 11, 2017

(54) SINGLE PHASE DIFFERENTIAL CONVERSION CIRCUIT, BALUN, SWITCH, AND COMMUNICATION DEVICE

(71) Applicant: Sony Corporation, Tokyo (JP)

(72) Inventors: Naoto Yoshikawa, Tokyo (JP); Ken Yamamoto, Tokyo (JP)

(73) Assignee: SONY CORPORATION, Tokyo (JP)

( * ) Notice: Subject to any disclaimer, the term of this patent is extended or adjusted under 35 U.S.C. 154(b) by 63 days.

(21) Appl. No.: 14/394,660

(22) PCT Filed: May 14, 2013

(86) PCT No.: PCT/JP2013/063424
§ 371 (c)(1),
(2) Date: Oct. 15, 2014

(87) PCT Pub. No.: WO2013/179890
PCT Pub. Date: Dec. 5, 2013

(65) Prior Publication Data
US 2015/0092892 A1    Apr. 2, 2015

(30) Foreign Application Priority Data

May 28, 2012   (JP) .................................. 2012-120939
May 28, 2012   (JP) .................................. 2012-120940

(51) Int. Cl.
| H03K 5/13 | (2014.01) |
| H03K 5/02 | (2006.01) |
| H03H 11/32 | (2006.01) |
| H04B 1/18 | (2006.01) |
| H03K 17/16 | (2006.01) |
| H03F 3/30 | (2006.01) |

(52) U.S. Cl.
CPC ........... *H03K 5/023* (2013.01); *H03F 3/3091* (2013.01); *H03H 11/32* (2013.01); *H03K 17/163* (2013.01);
(Continued)

(58) Field of Classification Search
CPC ..................................................... H03K 5/023
See application file for complete search history.

(56) References Cited

U.S. PATENT DOCUMENTS

2007/0177317 A1*  8/2007  Kim .................... H01L 27/0266
                                                          361/56
2008/0062023 A1*  3/2008  Nakabo .................... H03F 1/26
                                                          341/143
(Continued)

FOREIGN PATENT DOCUMENTS

| JP | 62-295512 | 12/1987 |
| JP | 07-098335 | 4/1995 |

(Continued)

*Primary Examiner* — Daniel Puentes
(74) *Attorney, Agent, or Firm* — Chip Law Group

(57) ABSTRACT

Provided with one or more first transistors of a first conductivity type each including a gate, a source, and a drain, the gate being connected to an input terminal, the source being configured to be connected to a first voltage source, the drain being connected to an output node, one or more second transistors of a second conductivity type each including a gate, a source, and a drain, the gate being connected to the input terminal, the source being configured to be connected to a second voltage source, the drain being connected to the output node, a first resistor that is inserted and connected between the input terminal and the output node, a first output terminal that is connected to the input terminal, and a second output terminal that is directly or indirectly connected to the output node.

13 Claims, 23 Drawing Sheets

(52) U.S. Cl.
CPC ............. *H03K 17/165* (2013.01); *H04B 1/18* (2013.01); *H03K 2217/0018* (2013.01); *H03K 2217/0054* (2013.01)

(56) References Cited

U.S. PATENT DOCUMENTS

| | | | |
|---|---|---|---|
| 2011/0063032 A1* | 3/2011 | Lee | H03F 1/26 330/277 |
| 2012/0049938 A1* | 3/2012 | Ishimori | H03K 17/063 327/537 |

FOREIGN PATENT DOCUMENTS

| | | |
|---|---|---|
| JP | 09-260962 | 10/1997 |
| JP | 2000-269783 | 9/2000 |
| JP | 2002-216083 A | 8/2002 |
| JP | 2003-502898 A | 1/2003 |
| JP | 2005-110080 A | 4/2005 |
| JP | 2008-034406 | 2/2008 |
| JP | 2008-035153 | 2/2008 |
| JP | 2008-147735 A | 6/2008 |
| JP | 2009-081641 A | 4/2009 |
| JP | 2009-111751 A | 5/2009 |
| JP | 2010-088003 A | 4/2010 |
| JP | 2010-212801 | 9/2010 |
| JP | 2012-034011 A | 2/2012 |
| JP | 2012-034191 A | 2/2012 |

\* cited by examiner

SINGLE PHASE DIFFERENTIAL CONVERSION CIRCUIT, BALUN, SWITCH, AND COMMUNICATION DEVICE

TECHNICAL FIELD

The present disclosure relates to a single phase differential conversion circuit and a balun that convert a single phase signal into a differential signal, a switch that controls signal transmission and interruption, and a communication device.

BACKGROUND ART

In signal processing, a differential circuit that deals with a differential signal is often used. Compared to a single phase signal, a differential signal is less likely to be influenced by, for example, a noise (an in-phase noise), or allows a signal range to be widened twice. Therefore, a differential circuit is often used in a case of, for example, dealing with an analog signal having relatively small amplitude.

In a case that a single phase signal is supplied to such a differential circuit, it is necessary that a single phase differential conversion circuit is provided for converting the single phase signal to a differential signal and supplying the converted signal to the differential circuit. For example, in Patent Literature 1, disclosed is a balun circuit (a single phase differential conversion circuit) having a differential pair configured of two field effect transistors (FETs).

Also in a communication device, a high frequency switch (an RF switch) is often used in selecting, as an operation object, one circuit from a plurality of circuits or in selecting, as a processing object, one signal from a plurality of signals. Specifically, for example, in a wireless communication device having a transmission circuit and a reception circuit, a high frequency switch is used to connect an antenna with the transmission circuit in signal transmission, and to connect the antenna with the reception circuit in signal reception. Moreover, for example, in a reception circuit having a plurality of attenuators, a high frequency switch is used to switch the attenuators according to signal intensity.

As to such a high frequency switch, various technologies have been disclosed. For example, in Patent Literatures 2 to 4, disclosed is a high frequency switch that includes a switching transistor and a resistor connected to a gate of the switching transistor, and is configured to apply a control voltage to the switching transistor through the resistor.

CITATION LIST

Patent Literature

Patent Literature 1: JP 2000-269783A
Patent Literature 2: JP 2008-34406A
Patent Literature 3: JP 2008-35153A
Patent Literature 4: JP 2010-212801A

SUMMARY OF INVENTION

In signal processing, it is often desired that a noise generated in a circuit is lowered. In particular, in a case of dealing with an analog signal having relatively small amplitude, since a high signal to noise ratio (an S/N ratio) is important, it is desirable to lower a noise.

It is therefore desirable to provide a single phase differential conversion circuit, a balun, and a communication device that make it possible to lower a noise.

Moreover, a high frequency switch is desired, in general, in an ON state, to transmit an input signal with little loss and with a suppressed distortion, and on the other hand, in an OFF state, to interrupt an inputted signal sufficiently. In particular, in a case that a signal having large amplitude is inputted in an OFF state, sufficient interruption of the signal is desired.

It is therefore desirable to provide a switch and a communication device that make it possible, in a case that a signal having large amplitude is inputted in an OFF state, to sufficiently interrupt the signal.

A single phase differential conversion circuit according to an embodiment of the present technology includes one or more first transistors, one or more second transistors, a first resistor, a first output terminal, and a second output terminal. The one or more first transistors are of a first conductivity type and each include a gate, a source, and a drain, the gate being connected to an input terminal, the source being configured to be connected to a first voltage source, the drain being connected to an output node. The one or more second transistors are of a second conductivity type and each include a gate, a source, and a drain, the gate being connected to the input terminal, the source being configured to be connected to a second voltage source, the drain being connected to the output node. The first resistor is inserted and connected between the input terminal and the output node. The first output terminal is connected to the input node. The second output terminal is directly or indirectly connected to the output node.

A balun according to an embodiment of the present technology includes one or more first transistors, one or more second transistors, a first resistor, a first output terminal, and a second output terminal. The one or more first transistors are of a first conductivity type and each include a gate, a source, and a drain, the gate being connected to an input terminal, the source being configured to be connected to a first voltage source, the drain being connected to an output node. The one or more second transistors are of a second conductivity type and each include a gate, a source, and a drain, the gate being connected to the input terminal, the source being configured to be connected to a second voltage source, the drain being connected to the output node. The first resistor is inserted and connected between the input terminal and the output node. The first output terminal is connected to the input terminal. The second output terminal is directly or indirectly connected to the output node.

A switch according to an embodiment of the present technology includes one or more switching transistors and a nonlinear circuit. The one or more switching transistors each include a control terminal. The nonlinear circuit is respectively connected to the control terminal.

A first communication device according to an embodiment of the present technology includes the above-mentioned single phase differential conversion circuit.

A second communication device according to an embodiment of the present technology includes the above-mentioned switch.

A third communication device according to an embodiment of the present technology includes the above-mentioned single phase differential conversion circuit and the above-mentioned switch.

In the single phase differential conversion circuit, the balun, the first communication device, and the third communication device according to the above-described embodiments of the present technology, an input signal that is a single phase signal supplied to the input terminal is converted to a differential signal, and the converted signal is outputted from the first output terminal and the second output terminal. The first output terminal is connected to the input terminal, and the second output terminal is directly or indirectly connected to the output node.

In the switch, the second communication device, and the third communication device according to the above-described embodiments of the present technology, ON or OFF states of the one or more switching transistors are controlled by a voltage of the control terminal. The voltage is supplied through the nonlinear circuit.

According to the single phase differential conversion circuit, the balun, the first communication device, and the third communication device according to the above-described embodiments of the present technology, since the first output terminal is connected to the input terminal, and the second output terminal is directly or indirectly connected to the output node, it is possible to lower a noise.

According to the switch, the second communication device, and the third communication device in the above-described embodiments of the present technology, since the nonlinear circuit is connected to the control terminal of the one or more switching transistors, it is possible, in a case that a signal having large amplitude is inputted in an OFF state, to sufficiently interrupt the signal.

DESCRIPTION OF EMBODIMENTS

In the following, some embodiments of the present disclosure will be described with reference to the drawings. It is to be noted that description will be made in the following order.

1. First Embodiment (an RF switch)
2. Second Embodiment (a balun)
3. Third Embodiment (one example provided with an RF switch and a balun)
4. Application Example

1. First Embodiment

Configuration Example

Figure 1:
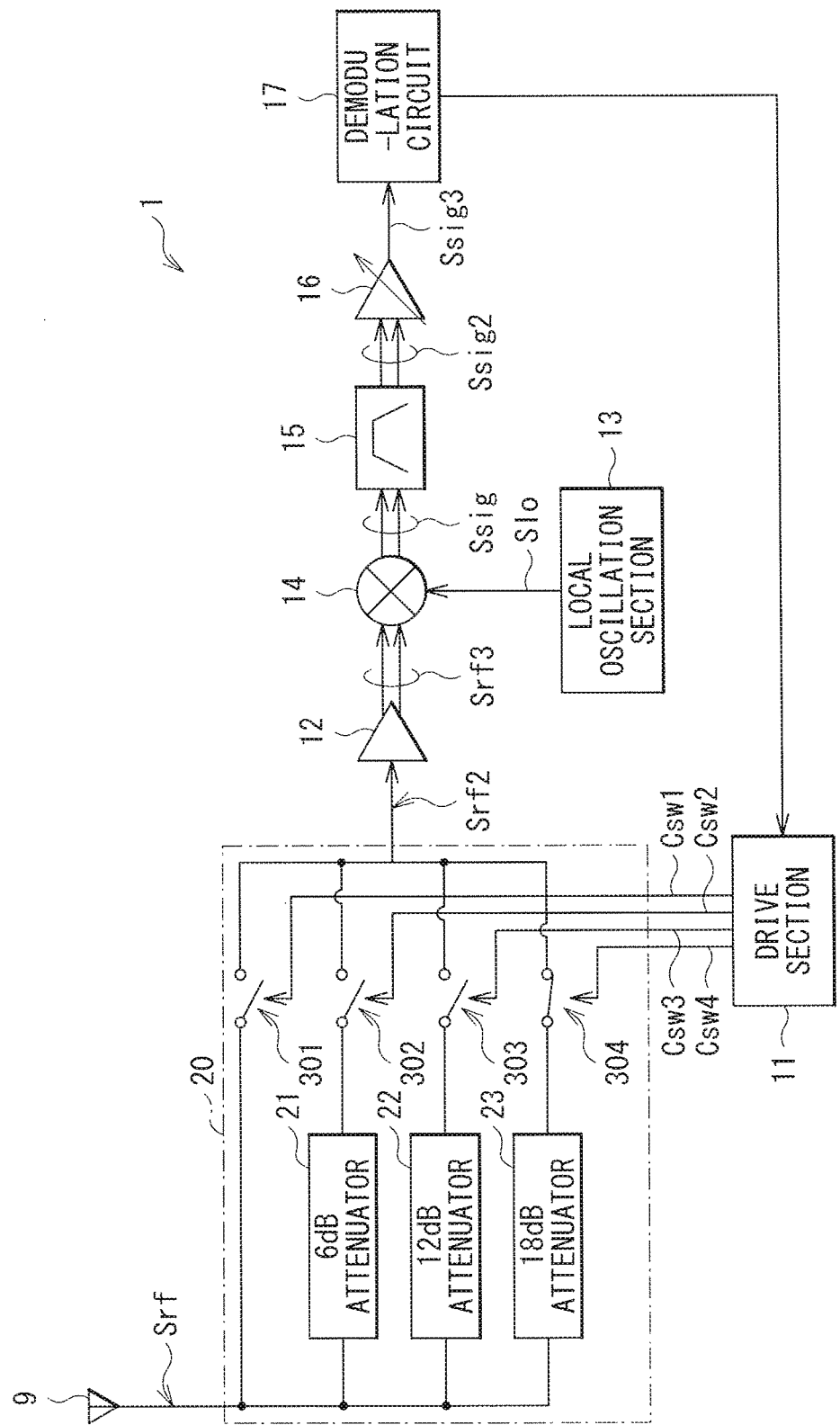
FIG. 1 is a block diagram illustrating one configuration example of a receiver according to a first embodiment of the present disclosure.

FIG. 1 illustrates one configuration example of a receiver 1 according to a first embodiment. The receiver 1 is a receiving device used in wireless communication. It is to be noted that since a switch and a communication device according to embodiments of the present disclosure are embodied by the present embodiment, description thereof will be made together.

The receiver 1 includes an attenuation section 20, a drive section 11, a low noise amplification circuit 12, a local oscillation section 13, a mixer 14, a filter 15, an IF amplifier 16, and a demodulation circuit 17.

The attenuation section 20 is configured to attenuate a signal Srf supplied from an antenna 9 by an attenuation amount according to signal amplitude (signal intensity) and to output the attenuated signal as a signal Srf2. The attenuation section 20 includes three attenuators (a 6 dB attenuator 21, a 12 dB attenuator 22, and an 18 dB attenuator 23), and four RF switches 301 to 304.

The 6 dB attenuator 21 is configured to attenuate the signal Srf by 6 [dB]. The 12 dB attenuator 22 is configured to attenuate the signal Srf by 12 [dB]. The 18 dB attenuator 23 is configured to attenuate the signal Srf by 18 [dB].

The RF switch 301 is configured to be turned on and off based on a switch control signal Csw1, and has an input terminal and an output terminal. The input terminal is supplied with the signal Srf, and the output terminal is connected to an output terminal of the attenuation section 20. The RF switch 302 is configured to be turned on and off based on a switch control signal Csw2, and has an input terminal and an output terminal. The input terminal is connected to an output terminal of the 6 dB attenuator 21, and the output terminal is connected to the output terminal of the attenuation section 20. The RF switch 303 is configured to be turned on and off based on a switch control signal Csw3, and has an input terminal and an output terminal. The input terminal is connected to an output terminal of the 12 dB attenuator 22, and the output terminal is connected to the output terminal of the attenuation section 20. The RF switch 304 is configured to be turned on and off based on a switch control signal Csw4, and has an input terminal and an output terminal. The input terminal is connected to an output terminal of the 18 dB attenuator 23, and the output terminal is connected to the output terminal of the attenuation section 20. In other words, in the attenuation section 20, the output terminals of the four RF switches 301 to 304 are connected to one another.

The drive section 11 is configured to generate the switch control signals Csw1 to Csw4 based on a control signal supplied from the demodulation circuit 17, and to drive the respective four RF switches 301 to 304 of the attenuation section 20.

This configuration allows the attenuation section 20 to adjust the attenuation amount with respect to the signal Srf supplied from the antenna 9 based on the switch control signals Csw1 to Csw4 supplied from the drive section 11, and to output the attenuated signal as the signal Sfr2. In this way, in the receiver 1, it is possible to supply a signal having appropriate amplitude to a post-stage circuit of the attenuator section 20 regardless of the signal amplitude of the signal Srf.

Next, description will be given on one configuration example of the RF switches 301 to 304. It is to be noted that, in the following, any one of the four RF switches 301 to 304 is simply referred to as an RF switch 30, and any one of the four switch control signals Csw1 to Csw4 is simply referred to as a switch control signal Csw.

Figure 2:
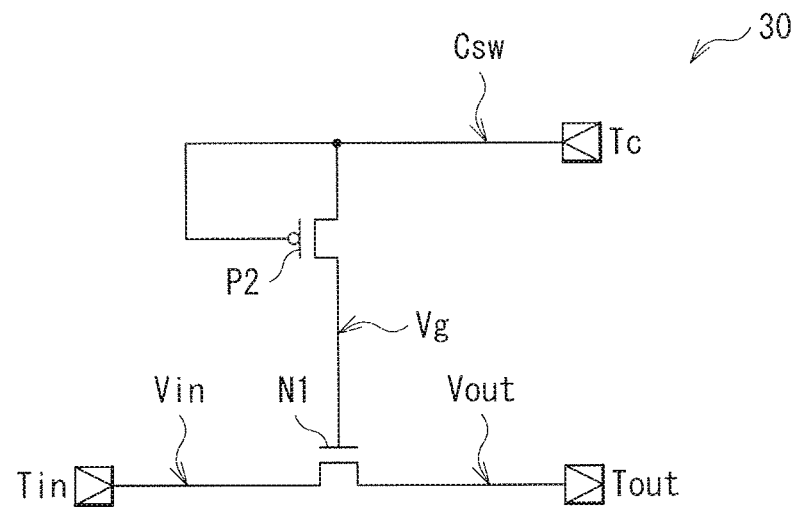
FIG. 2 is a circuit diagram illustrating one configuration example of an RF switch illustrated in FIG. 1.

FIG. 2 illustrates one configuration example of the RF switch 30. In the RF switch 30, a terminal Tc is supplied with the switch control signal Csw, a terminal Tin is supplied with the signal Srf or an attenuated signal of the signal Srf, and a terminal Tout is connected to the output terminal of the attenuation section 20. The RF switch 30 includes two transistors N1 and P2.

The transistor N1 is an N-type MOS (metal oxide semiconductor) transistor, and has a gate, a drain, and a source. The gate is connected to the transistor P2. Out of the drain and the source, one is connected to the terminal Tin, and another is connected to the terminal Tout. The transistor N1 is configured to function, in the RF switch 30, as a switching transistor that electrically connects or disconnects the terminal Tin and the terminal Tout. The transistor P2 is a P-type MOS transistor, and has a gate, a drain, and a source. The gate is connected to the terminal Tc. Out of the drain and the source, one is connected to the terminal Tc, and another is connected to the gate of the transistor N1. In other words, in the transistor P2, the gate and the drain or the source are connected to each other (so-called diode connected). The transistor P2 is configured to function, as described later, as a nonlinear element that allows impedance to be varied nonlinearly.

With this configuration, in the RF switch 30, in a case that a voltage of the switch control signal Csw is at a high level, the switch control signal Csw (a high level voltage) is supplied to the gate of the transistor N1 through the transistor P2. Thus, the RF switch 30 is turned on. On the other hand, in a case that the voltage of the switch control signal Csw is at a low level, the switch control signal Csw (a low level voltage) is supplied to the gate of the transistor N1 through the transistor P2. Thus, the RF switch 30 is turned off. On this occasion, as described later, a switch characteristic is enhanced by using a fact that impedance of the transistor P2 becomes nonlinear.

The low noise amplification circuit 12 is a circuit that is configured to amplify the signal Srf2 while suppressing generation of a noise, and to output the amplified signal as a signal Srf3. In the receiver 1, the low noise amplification circuit 12 is provided at a subsequent stage of the attenuation section 20, which makes it possible to enhance a signal to noise ratio (an S/N ratio) as the whole receiver 1. This enables reception of a weak radio wave.

The local oscillation circuit 13 is an oscillation circuit that is configured to generate a signal Slo having a same frequency as that of a carrier of wireless communication, and is configured of, for example, a frequency synthesizer using a PLL (phase locked loop).

The mixer 14 is configured to multiply the output signal Srf3 of the low noise amplification circuit 12 and the signal Slo to down-convert the output signal Srf3, thereby extracting a signal component superimposed on the carrier, to output the extracted signal component as a signal Ssig.

The filter 15 is a bandpass filter that is configured to eliminate, from the signal Ssig, an unnecessary frequency component generated in multiplying the signal Srf3 and the signal Slo in the mixer 14, to generate a signal Ssig2.

The IF amplifier 16 is a variable gain amplifier that is configured to amplify the signal Ssig2 supplied from the filter 15 to output the amplified signal as a signal Ssig3. Specifically, the IF amplifier 16 is configured to operate to allow amplitude of the signal Ssig3 to become predetermined amplitude, by adjusting a gain according to amplitude of the signal Ssig2 supplied from the filter 15. Thus, even in a case that differential amplitude of the signal Ssig2 is small, it is possible to allow the amplitude of the output signal Ssig3 to become sufficient amplitude for operation of the demodulation circuit 17 at a next stage.

The demodulation circuit 17 is configured to perform demodulation processing based on the signal Ssig3 supplied from the IF amplifier 16. Also, the demodulation circuit 17 has a function of supplying a control signal to the drive section 11 and controlling the attenuation amount in the attenuation section 20.

Here, the transistor N1 corresponds to one specific example of a "switching transistor" in the present disclosure. The gate of the transistor N1 corresponds to one specific example of a "control terminal" in the present disclosure. The transistor P2 corresponds to one specific example of a "nonlinear circuit" in the present disclosure.

(Operations and Functions)

Next, description will be given on operations and functions of the receiver 1 according to the present embodiment.

(Outline of General Operation)

First, an outline of the general operation of the receiver 1 will be described with reference to FIG. 1. The attenuation section 20 attenuates the signal Srf supplied from the antenna 9 according to signal amplitude (signal intensity), and outputs the attenuated signal as the signal Srf2. The drive section 11 generates, based on the control signal supplied from the demodulation circuit 17, the switch control signals Csw1 to Csw4 to drive the respective four RF switches 301 to 304 of the attenuation section 20. The low noise amplification circuit 12 amplifies the signal Srf2 while suppressing generation of a noise, and outputs the amplified signal as the signal Srf3. The local oscillation circuit 13 generates the signal Slo having the same frequency as that of the carrier of wireless communication. The mixer 14 multiplies the output signal Srf3 of the low noise amplification circuit 12 and the signal Slo to down-convert the output signal Srf3, generating the signal Ssig. The filter 15 eliminates, from the signal Ssig, the unnecessary frequency component generated in multiplying the signal Srf3 and the signal Slo in the mixer 14, to generate the signal Ssig2. The IF amplifier 16 amplifies the signal Ssig2 supplied from the filter 15, and outputs the amplified signal as the signal Ssig3. The demodulation circuit 17 performs demodulation processing based on the signal Ssig3 supplied from the IF amplifier 16, and supplies the control signal to the drive section 11 to control the attenuation amount in the attenuation section 20.

(Operations of RF Switch 30)

Figure 3:
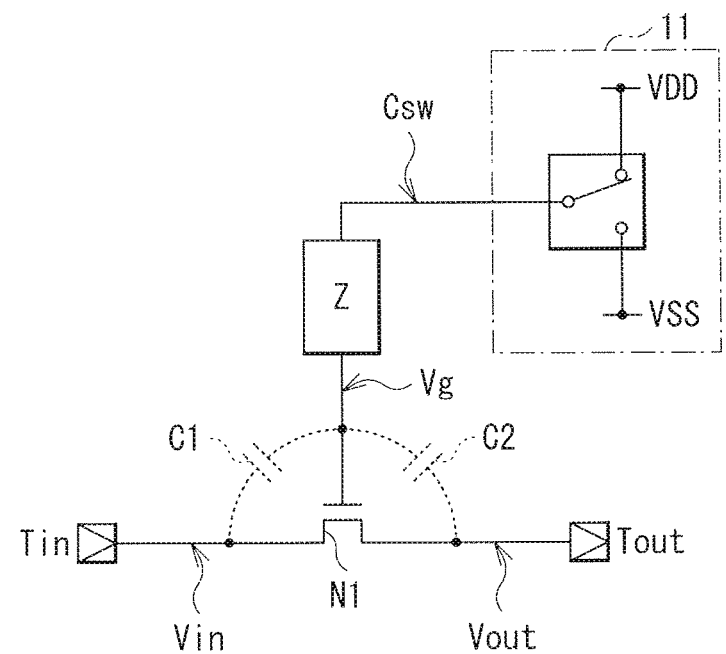
FIG. 3 is an explanatory diagram illustrating one example of a characteristic of the RF switch illustrated in FIG. 2.

FIG. 3 illustrates the operations of the RF switch 30. In the figure, the transistor P2 is denoted by impedance Z. Capacitances C1 and C2 are parasitic capacitances configured of so-called overlap capacitances between the gate and the source, or between the gate and the drain, in the transistor N1.

In a case that the drive section 11 supplies, as the switch control signal Csw, the high level voltage (a voltage VDD) to the RF switch 30, in the RF switch 30, the voltage VDD is supplied to the gate of the transistor N1 through the impedance Z. Thus, the transistor N1 is turned on.

On the other hand, in a case that the drive section 11 supplies, as the switch control signal Csw, the low level voltage (a voltage VSS, 0 V in this example) to the RF switch 30, the voltage VSS is supplied to the gate of the transistor N1, similarly through the impedance Z. Thus, the transistor N1 is turned off.

Next, description will be given on the operations of the RF switch 301 in the attenuation section 20, in a case that amplitude of the signal Srf supplied from the antenna 9 is large. In this example, description will be given on a case (a case C1) that the attenuation section 20 turns only the RF switch 301 on and outputs the signal Srf as it is, and a case (a case C2) that only the RF switch 304 is turned on and the signal Srf is attenuated by 18 [dB] and outputted.

Figure 4:
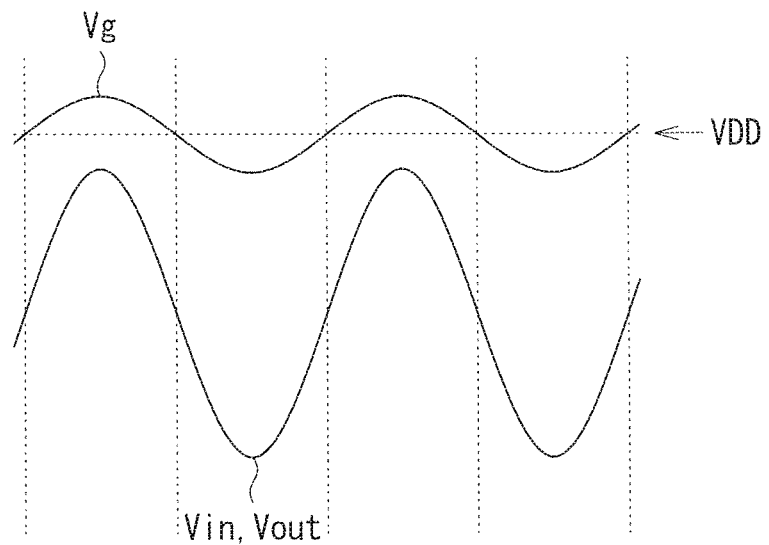
FIG. 4 is a timing waveform chart illustrating one operational example of the RF switch illustrated in FIG. 2.

FIG. 4 shows a timing waveform chart of the RF switch 301 in the case C1, indicating a waveform of an input voltage Vin at the terminal Tin, a waveform of the gate voltage Vg, and a waveform of an output voltage Vout at the terminal Tout. In the case C1, the drive section 11 outputs, as the switch control signal Csw1, the high level voltage (the voltage VDD) and outputs, as the switch control signals Csw2 to Csw4, the low level voltage (the voltage VSS).

In this example, since the amplitude of the signal Srf is large, as illustrated in FIG. 4, the RF switch 301 is supplied with the input voltage Vin having large amplitude. In the case C1, since the gate voltage Vg of the transistor N1 is at a high level (the voltage VDD), the transistor N1 is turned on, and the waveform of the output voltage Vout becomes a similar waveform to the waveform of the input voltage Vin.

On this occasion, in the RF switch 301, since the impedance Z of the transistor P2 is high, as illustrated in FIG. 4, a high frequency component of the input voltage Vin and the output voltage Vout is transmitted to the gate of the transistor N1 through the capacitances C1 and C2. In other words, the waveform of the gate voltage Vg is a waveform that is in-phase with the waveform of the input voltage Vin and so on. Accordingly, as the input voltage Vin and so on becomes higher, the gate voltage Vg also becomes higher, which makes it possible to reduce a possibility that the gate-source voltage Vgs of the transistor N1 becomes low. Thus, in the RF switch 301, it is possible to reduce a possibility of lowered linearity.

Figure 5:
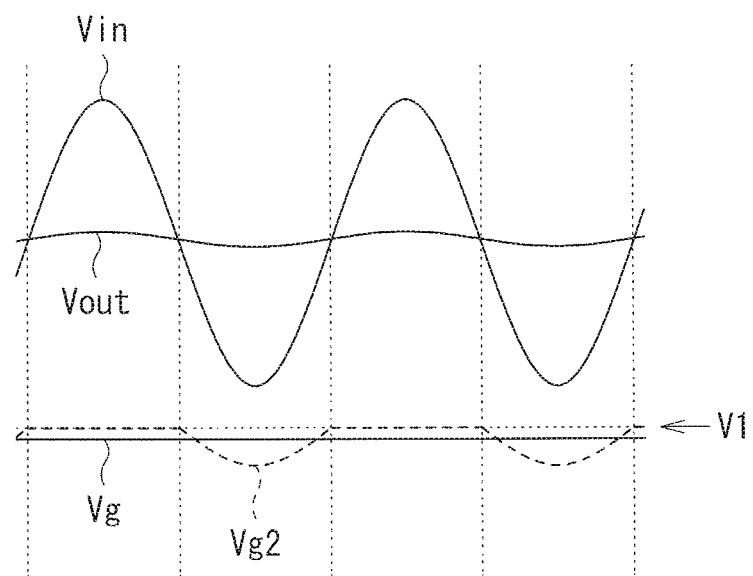
FIG. 5 is a timing waveform chart illustrating another operational example of the RF switch illustrated in FIG. 2.

FIG. 5 shows a timing waveform chart of the RF switch 301 in the case C2, indicating the waveform of the input voltage Vin, the waveform of the gate voltage Vg, and the waveform of the output voltage Vout. In the case C2, the drive section 11 outputs, as the switch control signal Csw4, the high level voltage (the voltage VDD) and outputs, as the switch control signals Csw1 to Csw3, the low level voltage (the voltage VSS).

Also in the case C2, similarly to the case C1, as illustrated in FIG. 5, the RF switch 301 is supplied with the input voltage Vin having large amplitude. On the other hand, the waveform of the output voltage Vout is a waveform in which the input voltage Vin is attenuated by 18 [dB]. This is because, in the case C2, the RF switches 301 to 303 are in an OFF state while the RF switch 304 is in an ON state.

In the RF switch 301, the gate voltage Vg of the transistor N1 is at a low level, and, similarly to the case C1, mainly the high frequency component of the input voltage Vin is transmitted to the gate of the transistor N1 through the capacitance C1. However, the high frequency component is filtered due to a parasitic capacitance of the transistor P2 and so on. Thus, as illustrated in FIG. 5, the gate voltage Vg becomes a substantially direct voltage. As will be shown below, the direct voltage depends on the amplitude of the input voltage Vin.

Figure 6:
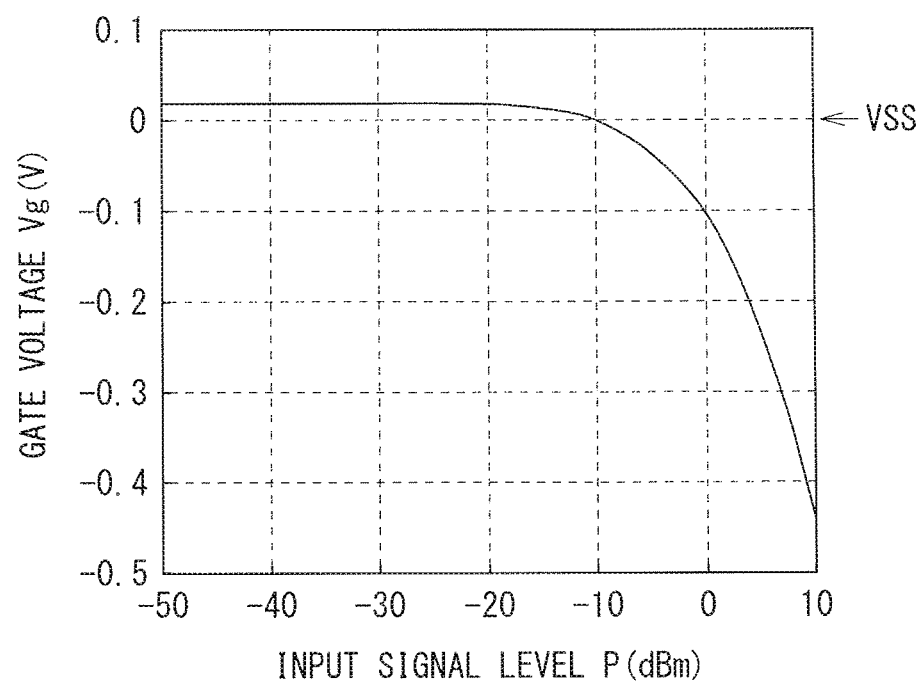
FIG. 6 is a characteristic diagram illustrating one example of a characteristic of the RF switch illustrated in FIG. 2.

FIG. 6 illustrates a relationship between a signal level (an input signal level P) of the signal Srf supplied from the antenna 9 and the gate voltage Vg. As illustrated, as the amplitude of the signal Srf becomes larger, the gate voltage Vg becomes lower. In other words, as the amplitude of the input voltage Vin of the RF switch 301 becomes larger, the gate voltage Vg of the transistor N1 in the RF switch 301 becomes lower.

As described above, as the amplitude of the input voltage Vin becomes larger, the gate voltage Vg becomes lower. A possible reason is as follows. Assume that there is no effect due to a parasitic capacitance of the transistor P2 and so on. Then, the waveform of the gate voltage Vg2 of the transistor N1 on this assumption is considered to become a waveform as illustrated by a broken line in FIG. 5. That is, the high frequency component of the input voltage Vin is transmitted to the gate of the transistor N1 through the capacitance C1, but if the gate voltage Vg2 tries to exceed a predetermined voltage V1, the transistor P2 is turned on, and the gate voltage Vg2 is clamped.

Figure 7A:
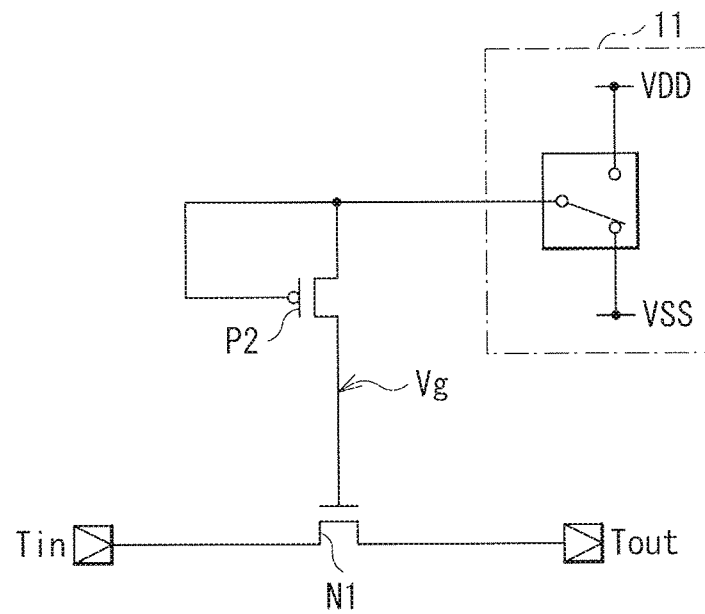
FIG. 7A is a circuit diagram in turning off the RF switch illustrated in FIG. 2.
Figure 7B:
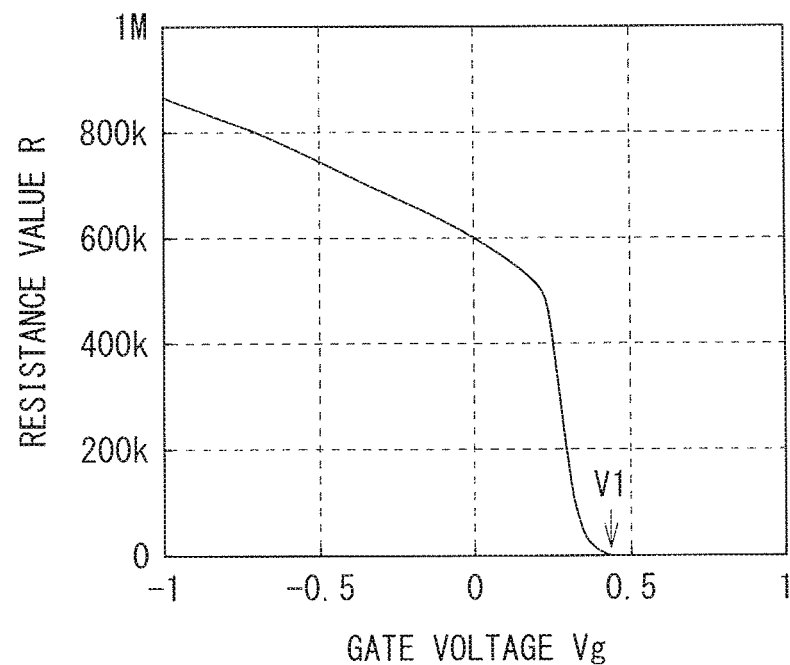
FIG. 7B is another characteristic diagram illustrating one example of a characteristic of the RF switch illustrated in FIG. 2.

FIGS. 7A and 7B illustrate the impedance of the transistor P2. FIG. 7A illustrates the RF switch 30 in an OFF state, and FIG. 7B illustrates resistance of the transistor P2 in the state illustrated in FIG. 7A. As illustrated in FIG. 7B, a resistance value of the transistor P2 is lower as the gate voltage Vg is higher, and has a nonlinear characteristic. Then, in a case that the drive section 11 outputs, as the switch control signal Csw, the low level voltage (the voltage VSS) (FIG. 7A), the transistor P2 is turned on when the gate voltage Vg becomes equal to or more than the voltage V1. The voltage V1 corresponds to a threshold voltage Vth of the transistor P2.

Accordingly, as illustrated in FIG. 5, even if the high frequency component of the input voltage Vin is transmitted to the gate of the transistor N1 through the capacitance C1, the gate voltage Vg2 does not exceed the voltage V1 but is clamped to the voltage V1. And, when the amplitude of the input voltage Vin becomes larger, the maximum voltage of the gate voltage Vg2 is the voltage V1, while the minimum voltage becomes lower as the amplitude of the input voltage Vin is increased.

Consequently, when the waveform as that of the gate voltage Vg2 illustrated in FIG. 5 is filtered due to the parasitic capacitance of the transistor P2 and so on, as illustrated in FIG. 6, the gate voltage Vg becomes lower as the amplitude of the input voltage Vin becomes larger.

As described above, in the RF switch 30, in an OFF state, as the amplitude of the input voltage Vin becomes larger, the gate voltage Vg becomes lower. Hence, it is possible to enhance an interruption characteristic in a case that the amplitude of the input voltage Vin is large, as will be explained below in comparison with a comparative example. This contributes to improved communication quality in the receiver 1 including the RF switch 30.

Comparative Example

Next, the functions of the present embodiment will be explained in comparison with the comparative example. The comparative example involves a receiver 1R that is configured using an RF switch 30R including a resistor instead of the transistor P2. Otherwise, the configuration is similar to the present embodiment (FIG. 1).

Figure 8:
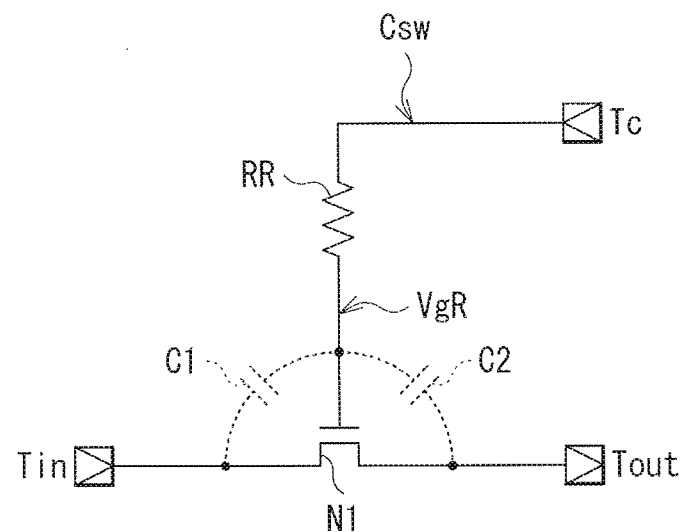
FIG. 8 is a circuit diagram illustrating one configuration example of an RF switch according to a comparative example.

FIG. 8 illustrates one configuration example of the RF switch 30R (301R to 304R). The RF switch 30R includes a resistor RR. The resistor RR, which has high resistance, is provided as a substitute for the transistor P2 in the present embodiment.

Figure 9:
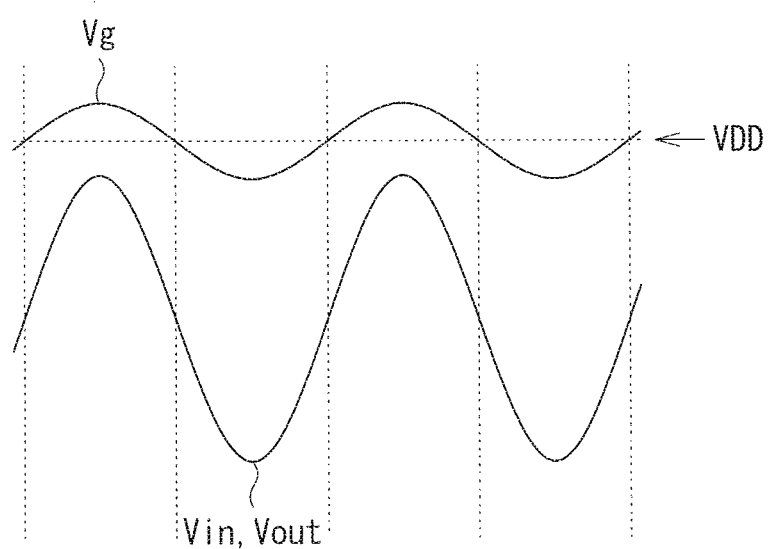
FIG. 9 is a timing waveform chart illustrating one operational example of the RF switch illustrated in FIG. 8.

FIG. 9 shows a timing waveform chart of the RF switch 301R in the case C1, indicating the waveform of the input voltage Vin at the terminal Tin, the waveform of the gate voltage Vg, and the waveform of the output voltage Vout at the terminal Tout. In this case, the RF switch 301R operates substantially in the same manner as the case of the present embodiment (FIG. 4).

Figure 10:
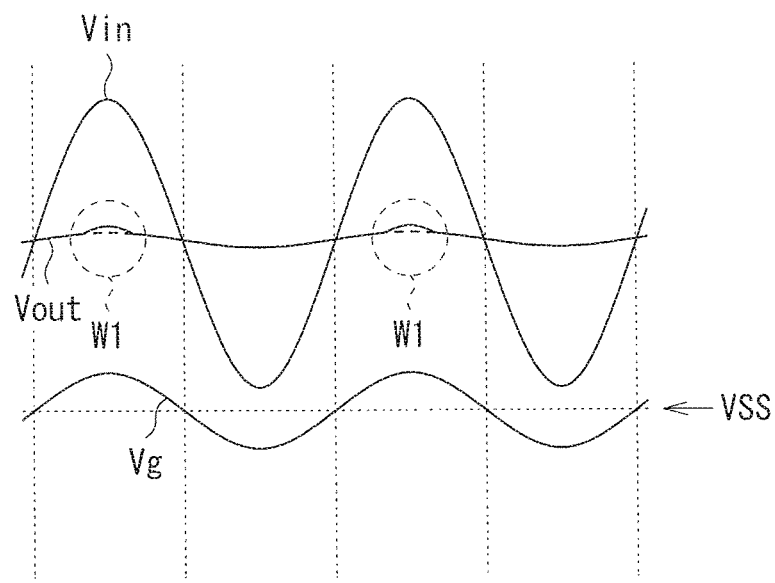
FIG. 10 is a timing waveform chart illustrating another operational example of the RF switch illustrated in FIG. 8.

FIG. 10 shows a timing waveform chart of the RF switch 301R in the case C2, indicating the waveform of the input voltage Vin at the terminal Tin, the waveform of the gate voltage Vg, and the waveform of the output voltage Vout at the terminal Tout.

In the case C2, since the RF switch 304R is turned on, the waveform of the output voltage Vout becomes a waveform in which the input voltage Vin is attenuated by 18 [dB]. On this occasion, there is a possibility that, when the input voltage Vin is high, the signal is transiently leaked to the output side (the output voltage Vout) (a part W1 in FIG. 10). That is, in the RF switch 301R, mainly the high frequency component of the input voltage Vin is transmitted to the gate of the transistor N1 through the capacitance C1, and the gate voltage Vg swings in-phase with the input signal Vin (FIG. 10). Accordingly, in the RF switch 301R, when the gate voltage Vg is high, the gate-source voltage Vgs (a voltage between the gate voltage Vg and the output voltage Vout) of the transistor N1 becomes smaller, causing a possibility of a leak of the input voltage Vin to the output side. In such a case, there is a possibility of degradation in communication quality, as will be shown below.

Figure 11:
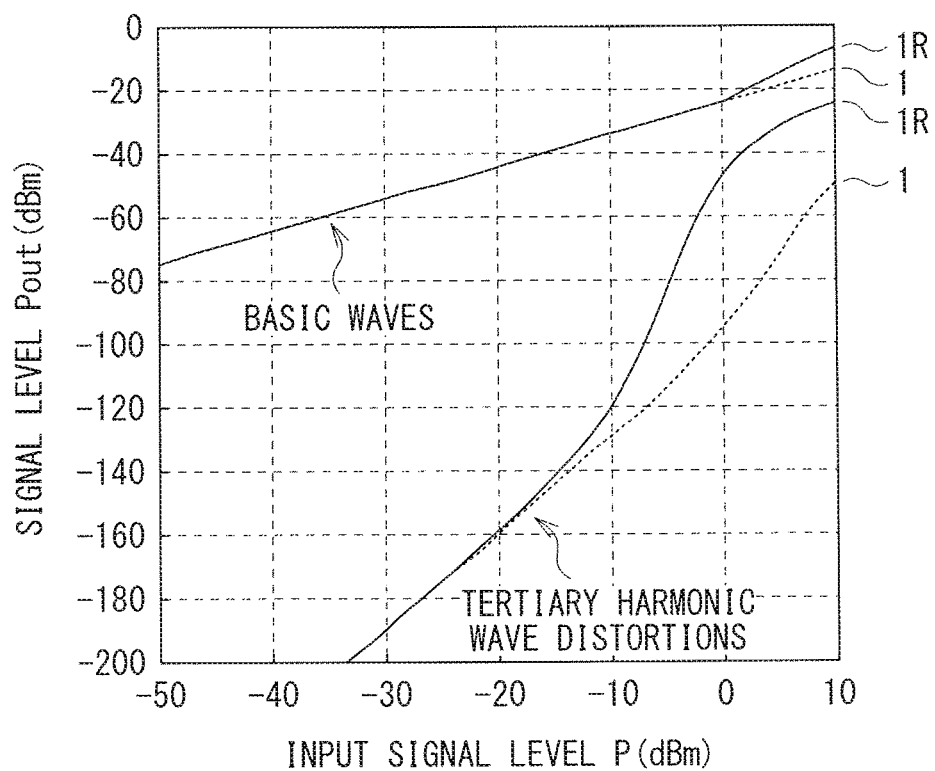
FIG. 11 is a characteristic diagram illustrating characteristics of the receivers according to the first embodiment and the comparative example.

FIG. 11 illustrates characteristics of intermodulation distortions in the receiver 1 according to the present embodiment and in the receiver 1R according to the comparative example. This example shows a simulation result in the case C2 regarding basic waves and tertiary harmonic wave distortions (IM3) at input ends of the low noise amplification circuits 12 in the receivers 1 and 1R.

In the receiver 1R according to the comparative example, in a region where the input signal level P is large, the tertiary harmonic wave distortion increases more than a desired characteristic, and the basic wave also becomes high. This is caused by a leak of the input signal Vin to the output side through the RF switch 301R, as illustrated in FIG. 10. In such a case, resistance to interference by a disturbing wave is lowered, which deteriorates communication quality.

On the other hand, in the receiver 1 according to the present embodiment, even in the region where the input signal level P is large, the basic wave and the tertiary harmonic wave distortion do not increase, attaining a desired characteristic. Accordingly, it is possible to enhance resistance to interference by a disturbing wave, leading to improved communication quality.

(Effects)

As described above, in the present embodiment, since the gate of the transistor N1 is supplied with the control signal through the nonlinear element, it is possible to enhance a switch characteristic even in a case that amplitude of an input signal is large.

Moreover, in the present embodiment, since the transistor P2 is used as the nonlinear element, it is possible to simplify a circuit configuration.

Modification Example 1-1

Figure 12A:
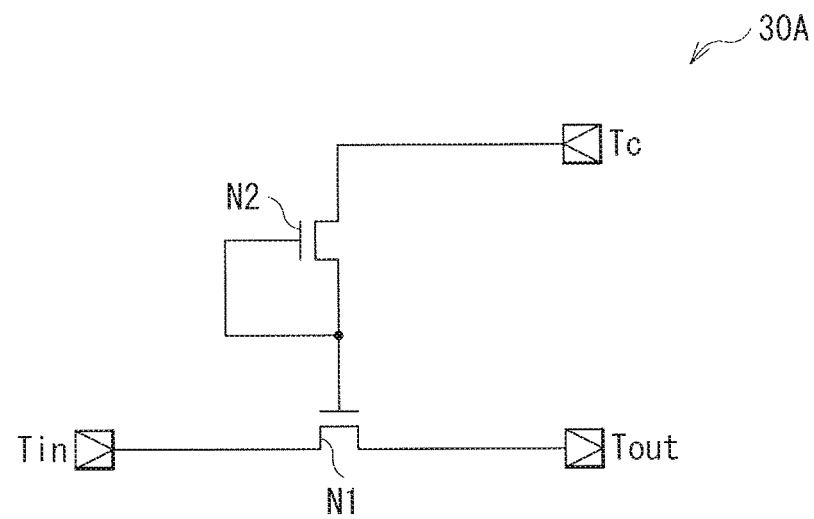
FIG. 12A is a circuit diagram illustrating one configuration example of an RF switch according to one modification example of the first embodiment.
Figure 12B:
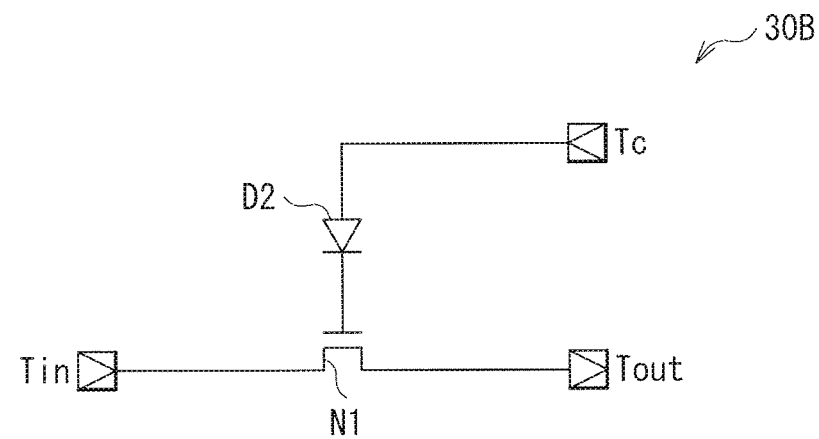
FIG. 12B is a circuit diagram illustrating one configuration example of an RF switch according to another modification example of the first embodiment.

In the above-described example embodiment, as the nonlinear element, a P-type MOS transistor (the transistor P2) is used, but this is not limitative. Instead, for example, as illustrated in FIG. 12A, an N-type MOS transistor (a transistor N2) may be used. In the RF switch 30A, the transistor N2 has a gate, a drain, and a source. One of the drain and the source, and the gate are connected to the gate of the transistor N1. Another of the drain and the source is connected to the terminal Tc. Alternatively, for example, as illustrated in FIG. 12B, a diode D2 may be used. In the RF switch 30B, the diode D2 has an anode and a cathode. The anode is connected to the terminal Tc, and the cathode is connected to the gate of the transistor N1.

Modification Example 1-2

Figure 13A:
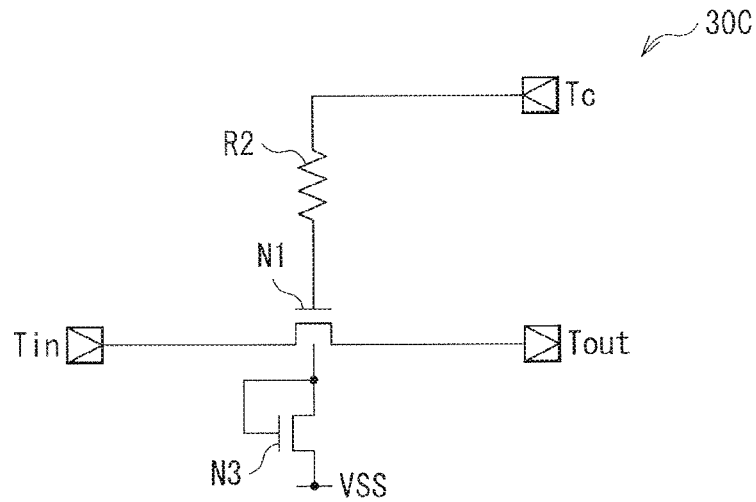
FIG. 13A is a circuit diagram illustrating one configuration example of an RF switch according to another modification example of the first embodiment.
Figure 13B:
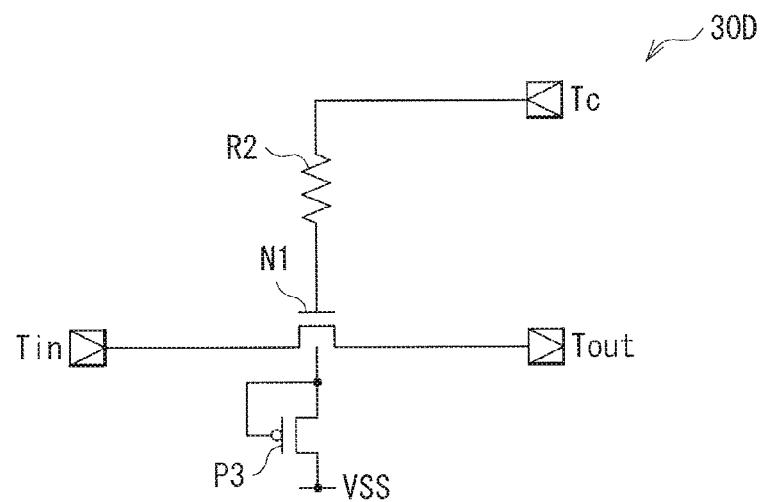
FIG. 13B is a circuit diagram illustrating one configuration example of an RF switch according to another modification example of the first embodiment.
Figure 13C:
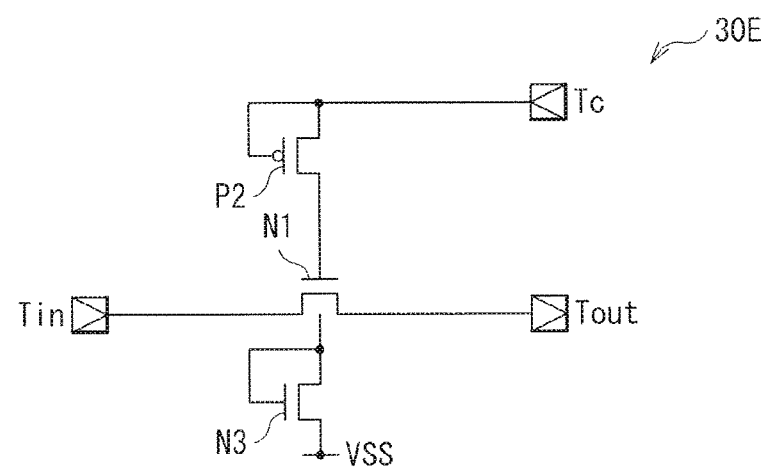
FIG. 13C is a circuit diagram illustrating one configuration example of an RF switch according to another modification example of the first embodiment.

In the above-described example embodiment, the nonlinear element (the transistor P2) is connected to the gate of the transistor N1, but this is not limitative. Instead, for example, as illustrated in FIGS. 13A to 13C, the nonlinear element may be connected to a back gate of the transistor N1. In an RF switch 30C as illustrated in FIG. 13A, a resistor R2 is provided between the gate of the transistor N1 and the terminal Tc, and a transistor N3 is connected to the back gate of the transistor N1. The transistor N3 is an N-type MOS transistor, and has a gate, a drain, and a source. One of the drain and the source, and the gate are connected to the back gate of the transistor N1. Another of the drain and the source is supplied with the voltage VSS (for example, 0 V). In an RF switch 30D as illustrated in FIG. 13B, the resistor R2 is connected to the gate of the transistor N1, and a transistor P3 is connected to the back gate of the transistor N1. The transistor P3 is a P-type MOS transistor, and has a gate, a drain, and a source. One of the drain and the source, and the gate are supplied with the voltage VSS (for example, 0 V). Another of the drain and the source is connected to the back gate of the transistor N1. In an RF switch 30E as illustrated in FIG. 13C, similarly to FIG. 2, the transistor P2 is connected to the gate of the transistor N1, and similarly to FIG. 13A, the transistor N3 is connected to the back gate of the transistor N1. As described above, FIG. 2, FIGS. 12A and 12B, and FIGS. 13A to 13C and so on may be combined to constitute the RF switch.

Modification Example 1-3

In the above-described example embodiment, as the switching transistor, an N-type MOS transistor (the transistor N1) is used, but this is not limitative. Instead, for example, a P-type MOS transistor may be used. The details of the present modification example is as follows.

Figure 14:
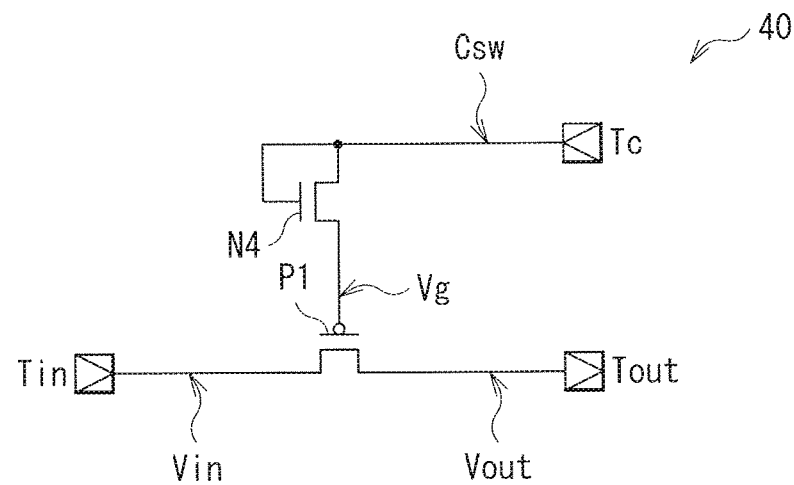
FIG. 14 is a circuit diagram illustrating one configuration example of an RF switch according to another modification example of the first embodiment.

FIG. 14 illustrates one configuration example of an RF switch 40 (401 to 404) according to the present modification example. The RF switch 40 includes two transistors P1 and N4. The transistor P1 is a P-type MOS transistor, and has a gate, a source, and a drain. The gate is connected to the transistor N4. One of the source and the drain is connected to the terminal Tin, and another is connected to the terminal Tout. The transistor N4 is an N-type MOS transistor, and has a gate, a drain, and a source. One of the drain and the source, and the gate are connected to the terminal Tc, and another is connected to the gate of the transistor P1.

In this configuration, in a case that the drive section 11 supplies, as the switch control signal Csw, the low level voltage (the voltage VSS) to the RF switch 40, the gate voltage Vg of the transistor P1 becomes the voltage VSS, and the transistor P1 is turned on. In a case that the drive section 11 supplies, as the switch control signal Csw, the high level voltage (the voltage VDD) to the RF switch 40, the gate voltage Vg of the transistor N1 becomes the voltage VDD, and the transistor P1 is turned off.

Figure 15:
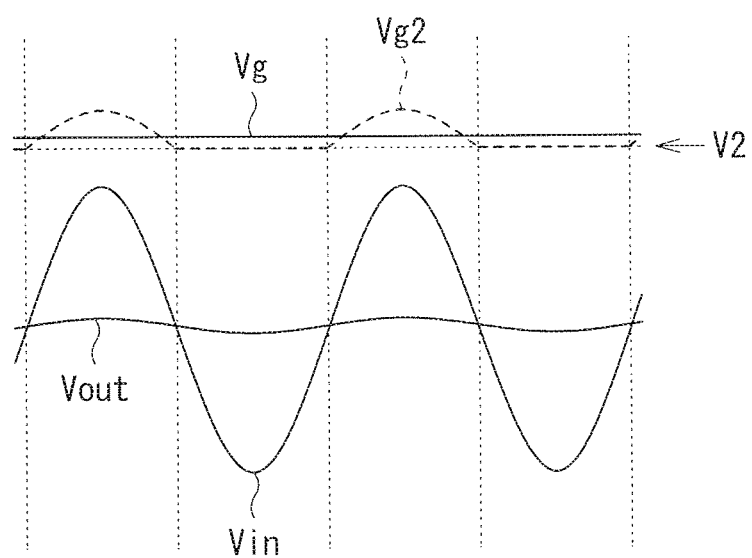
FIG. 15 is a timing waveform chart illustrating one operational example of the RF switch illustrated in FIG. 14

FIG. 15 shows a timing waveform chart of the RF switch 401 in the case C2, indicating the waveform of the input voltage Vin at the terminal Tin, the waveform of the gate voltage Vg, and the waveform of the output voltage Vout at the terminal Tout. Here, the voltage V2 refers to a voltage corresponding to the voltage V1 in the above-described example embodiment. In the case C2, the drive section 11 outputs, as the switch control signal Csw4, the high level voltage (the voltage VDD) and outputs, as the switch control signal Csw1 to Csw3, the low level voltage (the voltage VSS).

Also in the RF switch 401, mainly the high frequency component of the input voltage Vin is transmitted to the gate of the transistor P1 through the capacitance C1. However, because of filtering due to a parasitic capacitance of the transistor N4 and so on, the gate voltage Vg becomes, as illustrated in FIG. 15, a substantially direct voltage. The direct voltage becomes higher as the amplitude of the input voltage Vin becomes larger. This is because, in the present modification example, unlike FIG. 7B, a resistance value of the transistor N4 becomes lower as the gate voltage Vg is lower.

As described above, in the RF switch 40, in an OFF state, as the amplitude of the input voltage Vin becomes larger, the gate voltage Vg becomes higher. Hence, it is possible to enhance an interruption characteristic in a case that the amplitude of the input voltage Vin is large.

Modification Example 1-4

Figure 16:
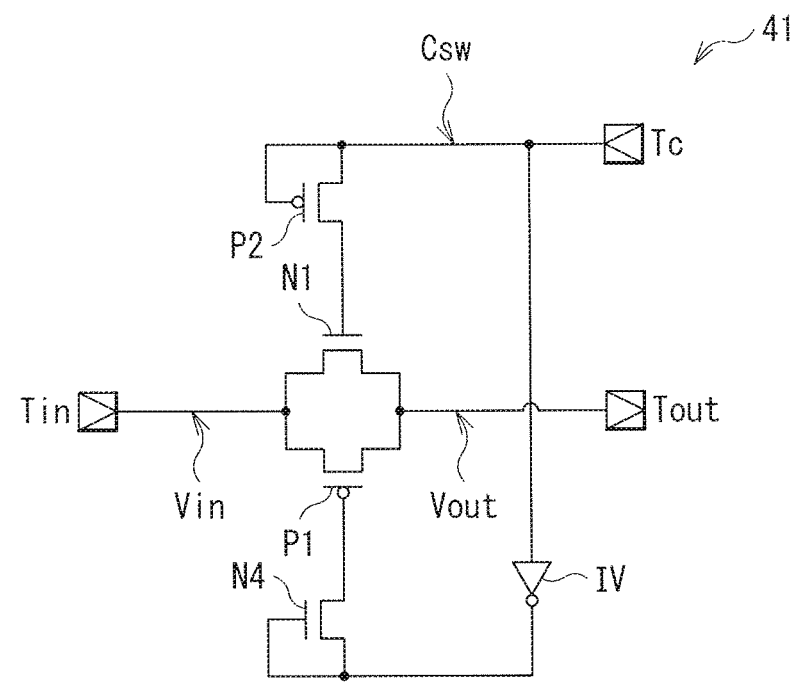
FIG. 16 is a circuit diagram illustrating one configuration example of an RF switch according to another modification example of the first embodiment.

In the above-described example embodiment, as the switching transistor, only an N-type MOS transistor (the transistor N1) is used, but this is not limitative. Alternatively, for example, as illustrated in FIG. 16, as the switching transistor, also a P-type MOS transistor (the transistor P1) may be further used to obtain a transmission gate configuration. An RF switch 41 is a combination of the configurations as illustrated in FIGS. 2 and 14.

Modification Example 1-5

Figure 17:
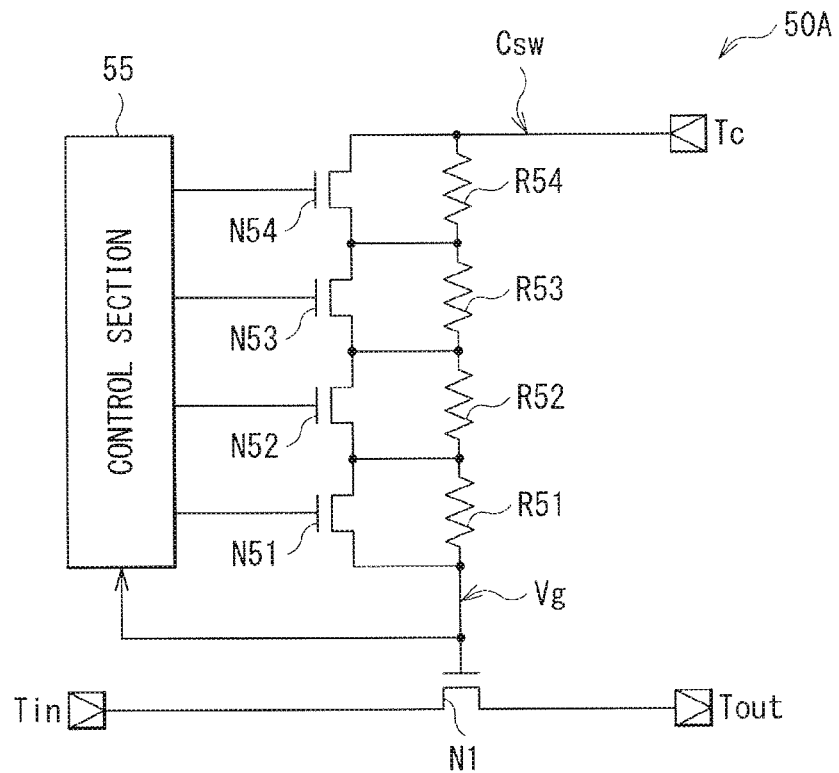
FIG. 17 is a circuit diagram illustrating one configuration example of an RF switch according to another modification example of the first embodiment.
Figure 18:
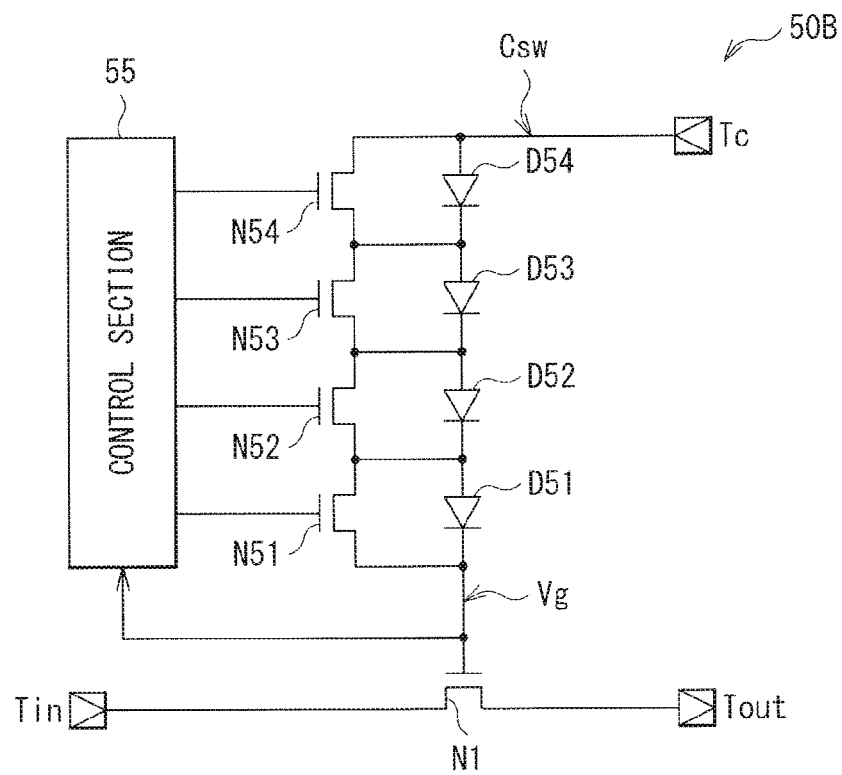
FIG. 18 is a circuit diagram illustrating one configuration example of an RF switch according to another modification example of the first embodiment.
Figure 19:
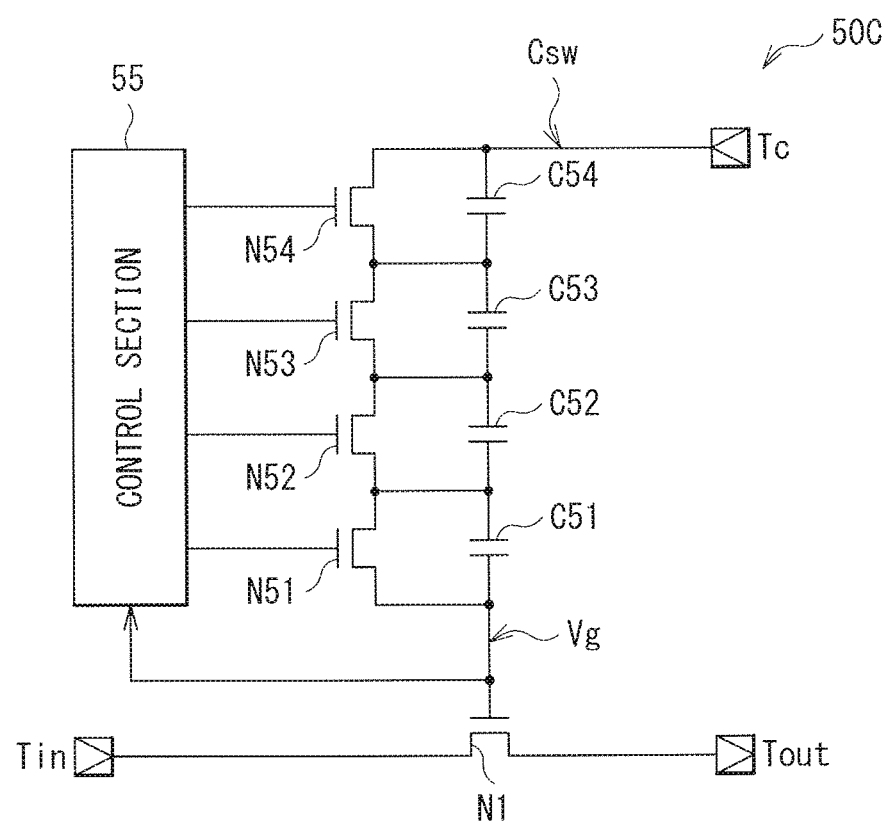
FIG. 19 is a circuit diagram illustrating one configuration example of an RF switch according to another modification example of the first embodiment.

In the above-described example embodiment, as the nonlinear element, the transistor P2 is used, but this is not limitative. Alternatively, for example, as illustrated in FIG. 17, the nonlinear element may be attained by switching a plurality of resistors. An RF switch 50A includes the transistor N1, four resistors R51 to R54, four transistors N51 to N54, and a control section 55. The four resistors R51 to R54 are connected in series in this order between the gate of the transistor N1 and a terminal T1. The four transistors N51 to N54 are N-type MOS transistors, and each have a gate that is connected to the control section 55. The transistor N51 has a drain connected to one end of the resistor R51, and has a source connected to another end of the resistor R51. The transistor N52 has a drain connected to one end of the resistor R52, and has a source connected to another end of the resistor R52. The transistor N53 has a drain connected to one end of the resistor R53, and has a source connected to another end of the resistor R53. The transistor N54 has a drain connected to one end of the resistor R54, and has a source connected to another end of the resistor R54. The control section 55 is configured to apply, based on the gate voltage Vg of the transistor N1, control voltages to respective gates of the transistors N51 to N54, to control impedance of a circuit network between the gate of the transistor N1 and the terminal Tc to have a characteristic as illustrated in, for example, FIG. 7B. It is to be noted that, in this example, the resistors R51 to R54 are used, but this is not limitative. For example, as illustrated in FIG. 18, diodes D51 to D54 may be used, or as illustrated in FIG. 19, capacitors C51 to C54 may be used.

Moreover, in the above-described example embodiment, as the transistor N1, a MOS transistor (MOSFET) is used, but this is not limitative. Alternatively, for example, a junction transistor (JFET) or a metal semiconductor transistor (MESFET) may be used. Furthermore, the transistor N1 is not limited to a field effect transistor (FET), but for example, a bipolar transistor may be used.

Moreover, in the above-described example embodiment, the RF switch 30 is applied to the receiver 1, but this is not limitative. Alternatively, examples of possible applications include a transmitter or a communication device including a receiver and a transmitter.

2. Second Embodiment

Configuration Example

Next, description will be given on a receiver 2 according to a second embodiment. The present embodiment involves a receiver that is configured using a balun (a single phase differential conversion circuit). It is to be noted that since a single phase differential conversion circuit, a balun, and a communication device according to embodiments of the present disclosure are embodied by the present embodiment, description thereof will be made together.

Figure 20:
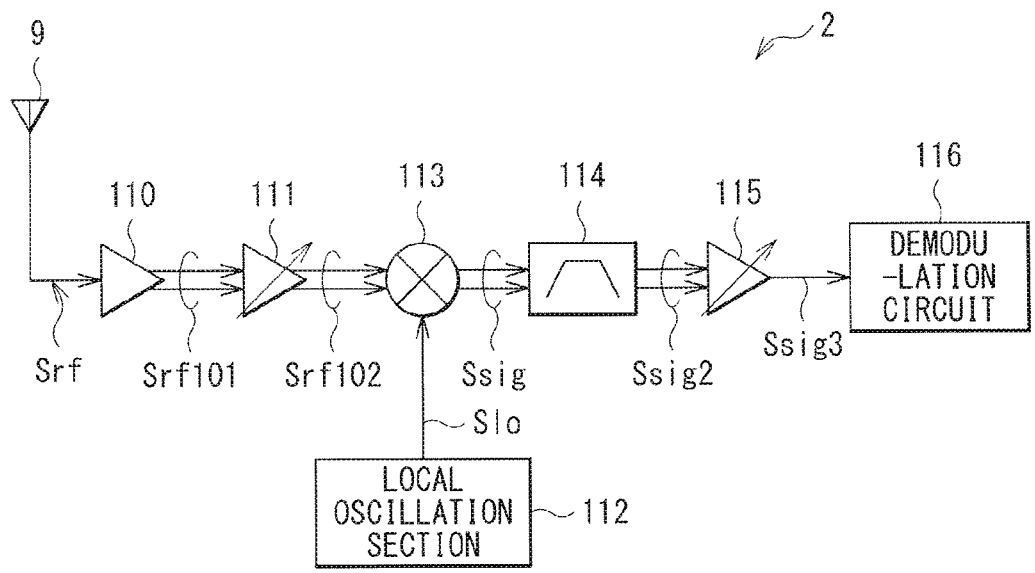
FIG. 20 is a block diagram illustrating one configuration example of a receiver according to a second embodiment of the present disclosure.

FIG. 20 illustrates one configuration example of the receiver 2 according to the second embodiment. The receiver 2 includes a balun 110, an RF amplifier 111, a local oscillation section 112, a mixer 113, a filter 114, an IF amplifier 115, and a demodulation circuit 116.

The balun 110 is a single phase differential conversion circuit that is configured to convert the signal Srf (a single phase signal) supplied from the antenna 9 to a differential signal, and to output the converted signal as a signal Srf101. The balun 110 is, though not illustrated, supplied with power by a different power source from those of other circuit blocks.

Figure 21:
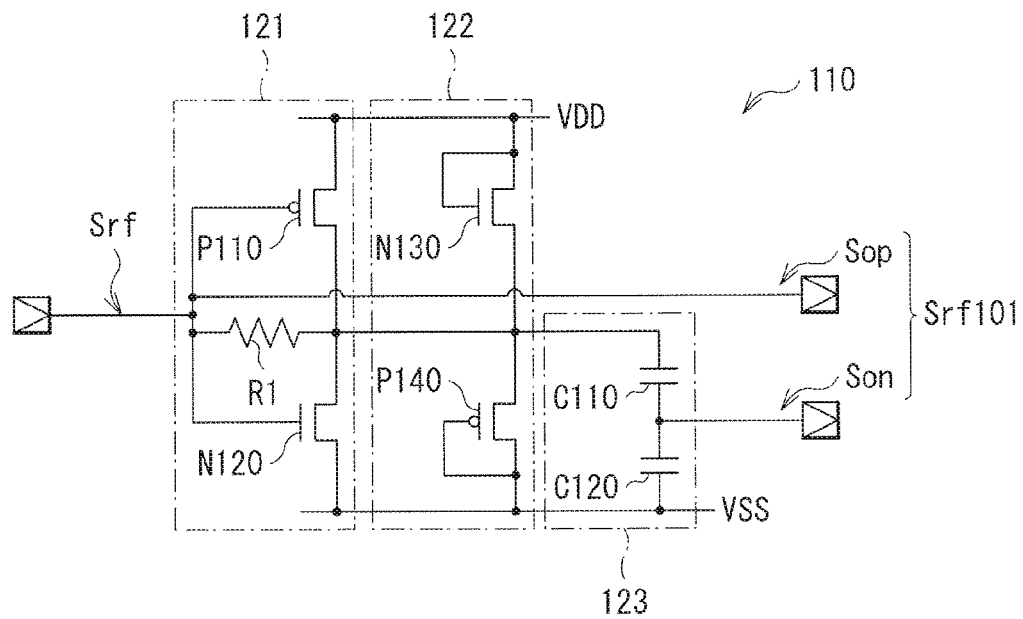
FIG. 21 is a circuit diagram illustrating one configuration example of a balun illustrated in FIG. 20.

FIG. 21 illustrates one configuration example of the balun 110. The balun 110 is configured to convert the signal Srf (a single phase signal) to the differential signal Srf101 that is configured of signals Sop and Son. The balun 110 includes transistors P110 and N120, a resistor R1, transistors N130 and P140, and capacitors C110 and C120.

The transistor P110 is a P-type MOS (metal oxide semiconductor) transistor, and has a gate, a drain, and a source. The gate is supplied with the signal Srf. The drain is connected to a drain of the transistor N120. The source is supplied with the power supply voltage VDD. The transistor N120 is an N-type MOS transistor, and has a gate, a drain, and a source. The gate is supplied with the signal Srf. The drain is connected to the drain of the transistor P110. The source is supplied with the power supply voltage VSS. The resistor R1 has one end connected to the gates of the transistors P110 and N120, and has another end connected to the drains of the transistors P110 and N120.

In other words, the transistors P110 and N120, and the resistor R1 constitute a so-called CMOS (complementary MOS) type inverter amplifier (CMOS amplifier 121). The resistor R1 is inserted, in the CMOS amplifier 121, as a feedback resistor, thereby setting an operating point of the gates of the transistor P110 and the transistor N120. The resistor R1 also has a function of performing impedance matching of input impedance of the balun 110 and impedance of the antenna 9.

The transistor N130 is an N-type MOS transistor, and has a gate, a drain, and a source. The gate and the drain are supplied with the power supply voltage VDD. The source is connected to the drains of the transistors P110 and N120. The transistor P140 is a P-type MOS transistor, and has a gate, a drain, and a source. The gate and the drain are connected to each other and are supplied with the power supply voltage VSS. The source is connected to the drains of the transistors P110 and N120.

In other words, the transistors N130 and P140 have the gates and the drains connected to each other (so-called diode-connected), and are configured to function as a load (a load section 122) of the above-described CMOS amplifier 121.

The capacitor C110 has one end connected to the drains of the transistors P110 and N120, and has another end connected to one end of the capacitor C120. The capacitor C120 has the one end connected to the another end of the capacitor C110. Another end of the capacitor C120 is supplied with the power supply voltage VSS.

In other words, the capacitors C110 and C120 constitute a so-called capacitance attenuator 123. Specifically, the capacitance attenuator 123 is configured to attenuate amplitude of a signal inputted to the one end of the capacitor C110 at a rate corresponding to a ratio of capacitance values of the capacitors C110 and C120, and to output, from the another end of the capacitor C110, the attenuated signal as the signal Son.

This circuit configuration allows the balun 110 to output, as the signal Sop, the input signal Srf (a single phase signal) as it is, and to output, as the signal Son, the signal that is outputted from the CMOS amplifier 121 and attenuated by the capacitance attenuator 123.

In this example, a sum gm1 (=gm(P110)+gm(N120)) of transconductance gm(P110) of the transistor P110 and transconductance gm(N120) of the transistor N120 is adapted to be larger than a sum gm2 (=gm(N130)+gm(P140)) of transconductance gm(N130) of the transistor N130 and transconductance gm(P140) of the transistor P140. Specifically, for example, in a case that the transistors P110, N120, N130, and P140 are equal in channel length to one another, a channel width of the transistor P110 is adapted to be larger than a channel width of the transistor P140, and a channel width of the transistor N120 is adapted to be larger than a channel width of the transistor N130. Hence, it is possible to allow a gain in a circuit configured of a CMOS type amplifier including the transistors P110 and N120, and the resistor R1, and a load including the transistors N130 and P140 to be larger than 1. Accordingly, as described later, by appropriate attenuation by the capacitors C110 and C120, it is possible to adjust a differential property of the signal Sop and the signal Son.

The RF amplifier 111 is a variable gain amplifier that is configured to amplify the signal Srf101 supplied from the balun 110 and to output the amplified signal as a signal Srf102. Specifically, the RF amplifier 111 operates, by adjusting a gain according to differential amplitude of the signal Srf101 supplied from the balun 110, to allow differential amplitude of the signal Srf102 to be predetermined amplitude. Thus, for example, in a case that the differential amplitude of the signal Srf101 supplied from the balun 110 is large, by keeping the differential amplitude of the signal Srf102 predetermined amplitude, it is possible to reduce an influence of a so-called disturbing wave. Furthermore, the RF amplifier 111 is configured to suppress generation of a noise, which makes it possible to suppress a noise figure (NF) of the whole receiver 2.

The local oscillation section 112 is an oscillation circuit that is configured to generate the signal Slo having a same frequency as that of a carrier of wireless communication, and is configured of, for example, a frequency synthesizer using a PLL (phase locked loop).

The mixer 113 is configured to multiply the output signal Srf102 of the RF amplifier 111 and the signal Slo to down-convert the output signal Srf102, thereby extracting a signal component superimposed on the carrier, to output the extracted signal component as the signal Ssig.

The filter 114 is a bandpass filter that is configured to eliminate, from the signal Ssig, an unnecessary frequency component generated in multiplying the signal Srf102 and the signal Slo in the mixer 113, to generate the signal Ssig2.

The IF amplifier 115 is a variable gain amplifier that is configured to amplify the signal Ssig2 supplied from the filter 114 to output the amplified signal as the signal Ssig3. Specifically, the IF amplifier 115 is configured to operate, similarly to the RF amplifier 111, to allow amplitude of the signal Ssig3 to become predetermined amplitude, by adjusting a gain according to differential amplitude of the signal Ssig2 supplied from the filter 114. Thus, even in a case that the differential amplitude of the signal Ssig2 is small, it is possible to allow the amplitude of the output signal Ssig3 to become sufficient amplitude for operation of the demodulation circuit 116 at a next stage.

The demodulation circuit 116 is configured to perform demodulation processing based on the signal Ssig3 supplied from the IF amplifier 115.

Here, the transistor P110 corresponds to one specific example of a "first transistor" in the present disclosure. The transistor N120 corresponds to one specific example of a "second transistor" in the present disclosure. The resistor R1 corresponds to one specific example of a "first resistor" in the present disclosure. The transistor N130 corresponds to one specific example of a "third transistor" in the present disclosure. The transistor P140 corresponds to one specific example of a "fourth transistor" in the present disclosure. The capacitance attenuator 123 corresponds to an "attenuation section" in the present disclosure. The capacitor C110 corresponds to one specific example of a "first capacitor" in the present disclosure. The capacitor C120 corresponds to one specific example of a "second capacitor" in the present disclosure.

(Operations and Functions)

Next, description will be given on operations and functions of the receiver 2 according to the present embodiment.

(Outline of General Operation)

First, an outline of the general operation of the receiver 2 will be described with reference to FIG. 20. The balun 110 converts the signal Srf (a single phase signal) supplied from the antenna 9 to a differential signal and outputs the converted signal as the signal Srf101. The RF amplifier 111 amplifies the signal Srf101 supplied from the balun 110 to output the amplified signal as the signal Srf102. The local oscillation section 112 generates the signal Slo having the same frequency as that of the carrier of wireless communication. The mixer 113 multiplies the signal Srf102 and the signal Slo to down-convert the output signal Srf102, generating the signal Sig. The filter 114 eliminates, from the signal Ssig, the unnecessary frequency component generated in multiplying the signal Srf102 and the signal Slo in the mixer 113, to generate the signal Ssig2. The IF amplifier 115 amplifies the signal Ssig2 supplied from the filter 114 to output the amplified signal as the signal Ssig3. The demodulation circuit 116 performs demodulation processing based on the signal Ssig3 supplied from the IF amplifier 115.

Next, detailed description will be made on some characteristics of the balun 110.

(Noise Characteristic of Balun 110)

The balun 110 is configured to restrain an influence on the differential signal Srf101 by a noise generated in the circuit, in the single phase differential conversion of the signal Srf. The details is as follows.

Figure 22A:
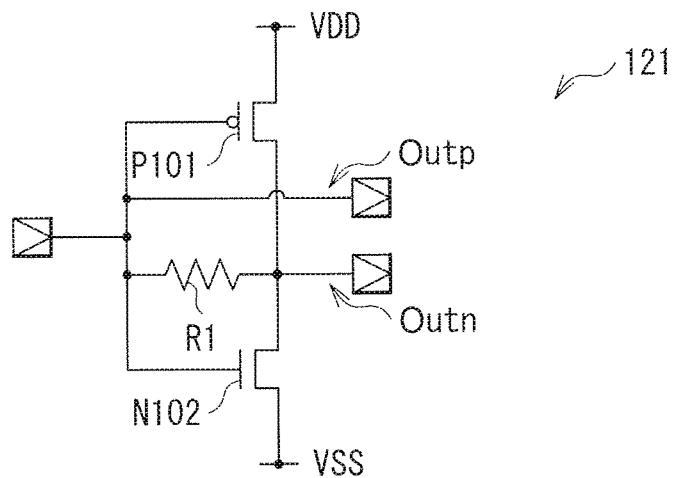
FIG. 22A is a circuit diagram illustrating one configuration example of a CMOS amplifier illustrated in FIG. 21.
Figure 22B:
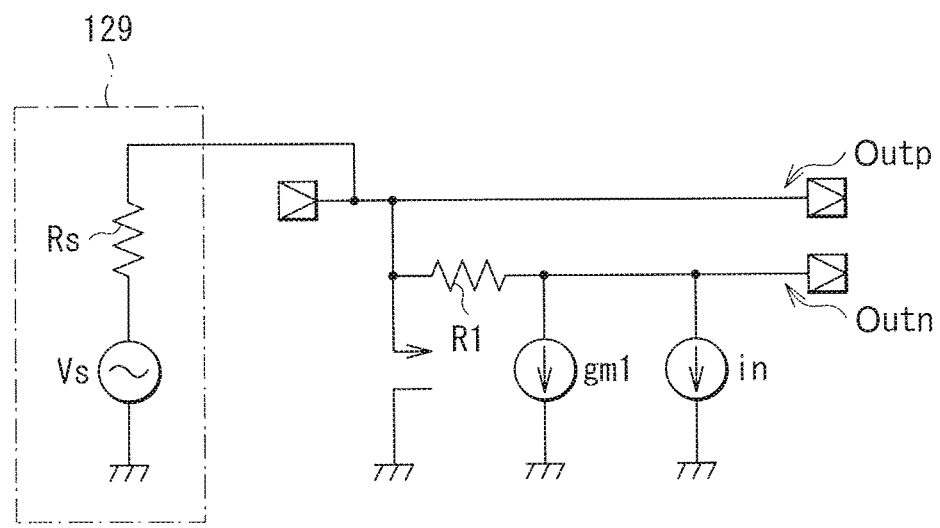
FIG. 22B is an explanatory diagram illustrating a characteristic of the CMOS amplifier illustrated in FIG. 21.

FIG. 22A illustrates a configuration of the CMOS amplifier 121 in the balun 110, and FIG. 22B illustrates a small signal equivalent circuit of the CMOS amplifier 121 together with a signal source 129. Here "in" denotes a current noise generated from the transistors P110 and N120. Moreover, the signal source 129 includes signal source impedance Rs and an alternating current signal source Vs. The signal source impedance Rs corresponds to, for example, impedance of the antenna 9.

Gain G1 of the CMOS amplifier 121, and output impedance Zout of the CMOS amplifier 121 are represented as follows.

[Numerical Expression 1]

$$G1 = \frac{gm1 \cdot R1 - 1}{gm1 \cdot R1 + 1} \quad (1)$$

$$Zout = \frac{Rs + R1}{gm1 \cdot Rs + 1} \quad (2)$$

Here, gm1 denotes, as mentioned above, the sum (gm(P110)+gm(N120)) of the transconductance gm(P110) of the transistor P110 and the transconductance gm(N120) of the transistor N120.

Moreover, input conversion noises vnp and vnn in output signals Outp and Outn of the CMOS amplifier 121 are represented as follows.

[Numerical Expression 2]

$$vnp = in \cdot \frac{Rs}{gm1 \cdot Rs + 1} \quad (3)$$

$$vnn = in \cdot \frac{Rs + R1}{gm1 \cdot R1 - 1} \quad (4)$$

Accordingly, an input conversion noise vndiff in a difference (a differential signal) of the output signals Outp and Outn is represented as follows.

[Numerical Expression 3]

$$vndiff = vnp - vnn = in \cdot \left( \frac{Rs}{gm1 \cdot Rs + 1} - \frac{Rs + R1}{gm1 \cdot R1 - 1} \right) \quad (5)$$

In the expression (5), in a case that gm1·Rs>>1 and R1>>Rs, since the first term and the second term cancel each other, it is possible to reduce vndiff sufficiently.

As described above, in the CMOS amplifier 121, it is possible to reduce a noise generated in the circuit. Hence, it is also possible to reduce a noise in the balun 110 including the CMOS amplifier 121.

Figure 23:
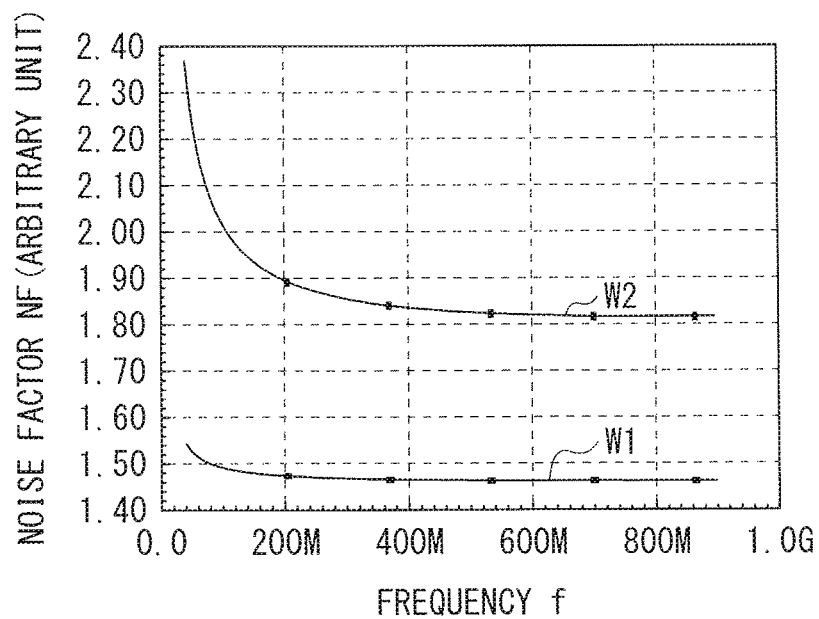
FIG. 23 is a characteristic diagram illustrating a characteristic of a noise factor of the balun illustrated in FIG. 20.

FIG. 23 illustrates one example of a simulation result regarding a noise factor in the balun 110. A waveform W1 denotes a noise factor in the differential signal (the signal Sop−the signal Son), and a waveform W2 denotes a noise factor in the signal Son.

As illustrated in FIG. 23, in the differential signal of the signal Srf101 (the waveform W1), it is possible to obtain a lower noise factor, compared to the single phase signal (the waveform W2). This means that, in the differential signal, noises that are superimposed commonly to the signal Sop and the signal Son cancel each other.

As described above, in the balun 110, since the CMOS amplifier 121 allows noises to be canceled each other, it is possible to lower a noise in the output signal Srf101.

Moreover, since the balun 110 is configured to include the CMOS amplifier 121, the balun 110 is likely to be influenced by a noise of the power source voltage VDD or a noise of the power source voltage VSS, which causes a possibility that the noises caused by these power source noises are superimposed on the output signal Srf101. Accordingly, as described above, the balun 110 is configured to be supplied with power by a different power source from those of other circuit blocks. In this way, it is possible to reduce a possibility that a noise caused by power source noises due to operations of other circuit blocks occurs in the output signal Srf101.

Moreover, in the receiver 2, since a noise generated in the balun 110 is made small, it is possible to simplify a circuit configuration. Specifically, in general, in a receiver, in order to reduce a noise factor in the whole receiver, a low noise amplifier (LNA) is provided at a first stage of the receiver. In the receiver 2, since the balun 110 converts a single phase signal to a difference signal with a low noise, and the RF amplifier 111 at the next stage amplifies the differential signal, such a low noise amplifier can be omitted, which contributes to a simplified circuit configuration.
(Distortion Characteristic of Balun 110)

The balun 110 is provided with the load section 122 in addition to the CMOS amplifier 121, which leads to an improved distortion characteristic. The details is as follows.

A gain G2 of an amplifier that is configured of the CMOS amplifier 121 and the load section 122 is represented as follows.

[Numerical Expression 4]

$$G2 = \frac{gm1 \cdot R1 - 1}{gm1 \cdot Rs + gm2 \cdot (Rs + R1) + 1} \quad (6)$$

Here, gm2 denotes, as mentioned above, the sum (gm(N130)+gm(P140)) of the transconductance gm(N130) of the transistor N130 and the transconductance gm(P140) of the transistor P140.

In the expression (6), in a case that gm1·Rs≫1 and gm2·Rs≫1 and R1≫Rs, the gain G2 becomes substantially equal to gm1/gm2. Thus, a distortion component generated by the transconductance gm1 is allowed to be canceled with the transconductance gm2. In other words, a distortion component generated in the CMOS amplifier 121 is allowed to be canceled with the load section 122.

Figure 24:
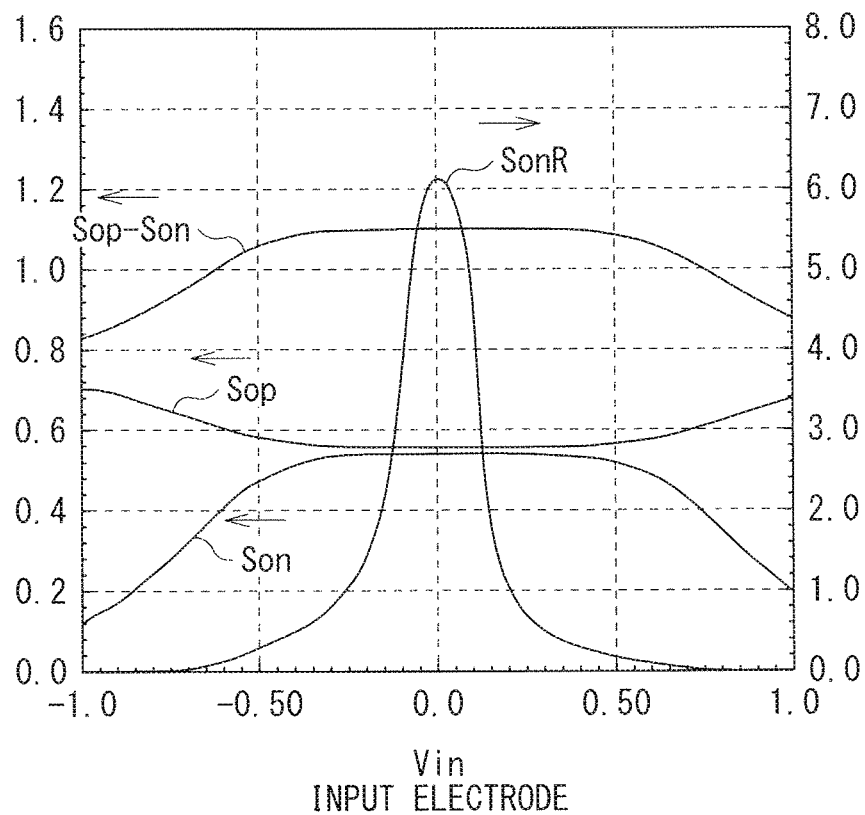
FIG. 24 is a characteristic diagram illustrating a distortion characteristic of the balun illustrated in FIG. 20.

FIG. 24 illustrates one example of a simulation result regarding an input output voltage characteristic of the balun 110. FIG. 24 illustrates a differential characteristic of the signals Sop and Son when the input voltage Vin is applied, and a differential characteristic of a difference (Sop−Son) of the signal Sop and the signal Son. Furthermore, FIG. 24 also illustrates, for comparison, a differential characteristic of a signal SonR in a configuration with the load section 122 omitted, which corresponds to the signal Son in the balun 110.

As illustrated in FIG. 24, in the differential characteristic of the signal Son, as compared to the differential characteristic of the signal SonR shown for comparison, a range of the input voltage Vin where the differential characteristic becomes flat is allowed to be widened. This means that allowing the load section 122 to be a load of the CMOS amplifier 121 makes it possible to attain a flatter characteristic.

Thus, also in the differential signal (Sop−Son) of the signal Srf101, a range of the input voltage Vin where the differential characteristic becomes flat is allowed to be widened. In this way, in the balun 110, by providing the load section 122, it is possible to widen an input linear range, which makes it possible to reduce a distortion.
(Differential Property of Signal Sop and Signal Son)

The balun 110 is provided with the capacitance attenuator 123, which contributes an improved differential property of the signal Sop and the signal Son. The details is as follows.

Since the signal Sop and the signal Son that are outputted by the balun 110 constitute the differential signal Srf101, it is desirable that the signal Sop and the signal Son have a same amplitude in addition to being in a reverse phase. Therefore, in the balun 110, the capacitance attenuator 123 is provided for adjustment of amplitude of the signal Son. Specifically, by making the gain G2 of an amplifier that is configured of the CMOS amplifier 121 and the load section 122 equal to or more than 1, and by adjusting a gain of the whole balun 110 including an attenuation amount in the capacitance attenuator 123, the amplitude of the signal Son is allowed to be adjusted to a desired value.

FIG. 24 illustrates a characteristic in a case that this adjustment is performed. As illustrated in FIG. 24, the signal Sop and the signal Son have a substantially same differential value (a value on the vertical axis) in a portion where the differential characteristic becomes flat. Thus, in a case that an alternate voltage is inputted in the portion of flatness (the input linear range), amplitude of the outputted signal Sop and signal of the signal Son become substantially same.

Thus, in the balun 110, since the capacitance attenuator 123 is provided for adjusting amplitude of the signal Son, it is possible to allow amplitude of the signal Sop and that of the signal Son to be substantially same, which enhances a differential property. In particular, even in a case that the gain G2 is desired to be higher in view of characteristics of the balun 110, it is possible to secure the differential property, by allowing the capacitance attenuator 123 to set an attenuation amount to be larger by that amount.
(Effects)

As described above, in the present embodiment, since the balun is configured using the CMOS amplifier, it is possible to reduce a noise in the differential signal.

Moreover, in the present embodiment, since so-called diode-connected MOS transistors are provided as a load of the CMOS amplifier, it is possible to improve a distortion characteristic.

Furthermore, in the present embodiment, since the capacitance attenuator is provided, it is possible to enhance the differential property of the output signals of the balun.

Modification Example 2-1

In the above-described example embodiment, characteristics of the CMOS amplifier 121, the load section 122, and the capacitance attenuator 123 are determined previously by design, but this is not limitative. Alternatively, these characteristics may be configured to be variable. In the following, detailed description will be given on a balun 110B according to the present modification example.

Figure 25:
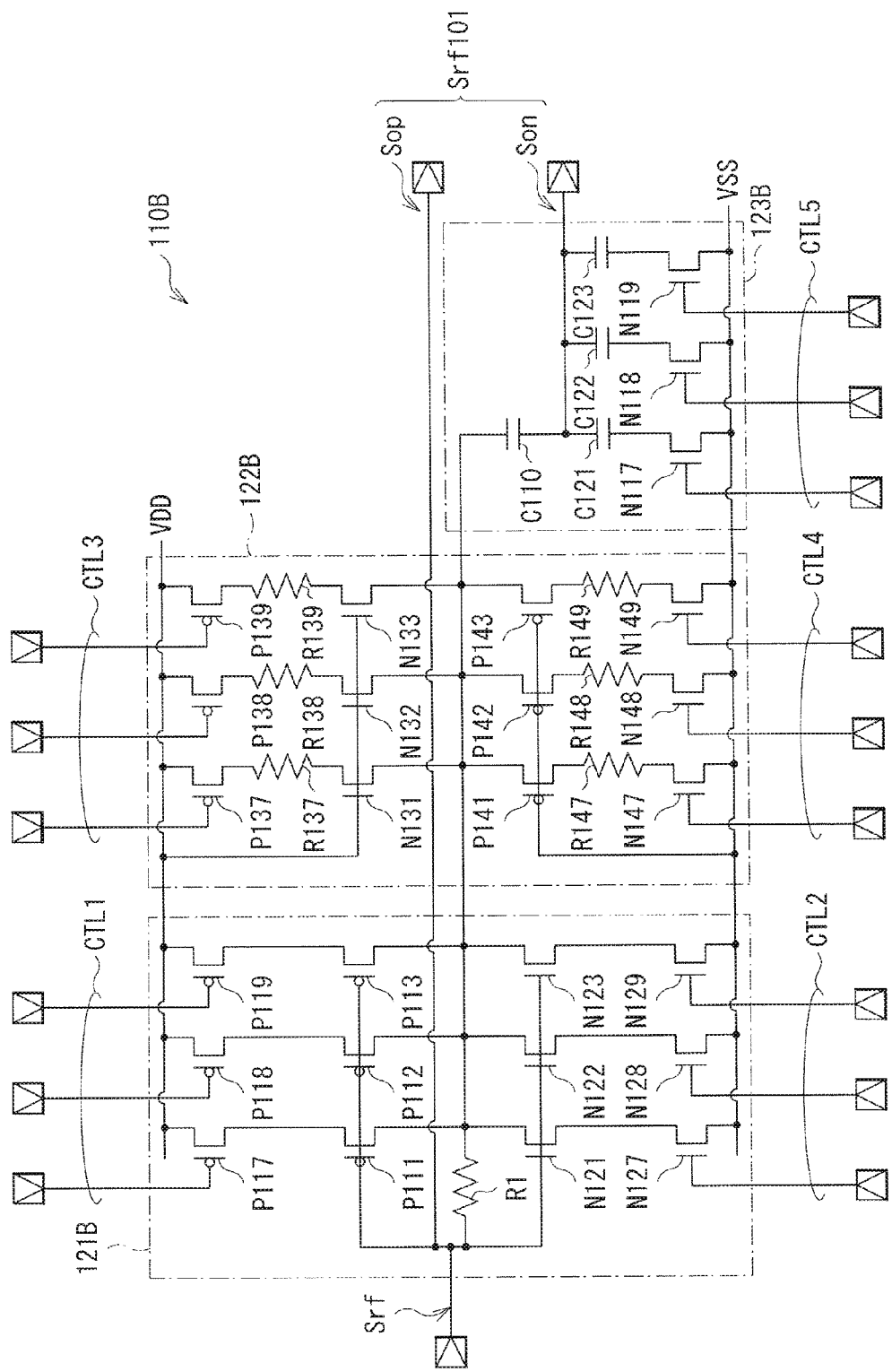
FIG. 25 is a block diagram illustrating one configuration example of a balun according to one modification example of the second embodiment.

FIG. 25 illustrates one configuration example of the balun 110B according to the present modification example. The balun 110B includes a CMOS amplifier 121B, a load section 122B, and a capacitance attenuator 123B.

The CMOS amplifier 121B is provided, in the CMOS amplifier 121 according to the above-described embodiment, with a plurality of transistors P110 (three transistors P111 to P113 in this example) that are configured to be selectable by a control signal CTL1. Similarly, the CMOS amplifier 121B is provided with a plurality of transistors N120 (three transistors N121 to N123 in this example) that are configured to be selectable by a control signal CTL2. Specifically, the CMOS amplifier 121B includes, for example, a transistor P117 that allows the transistor P111 to be selected. The transistor P117 is a P-type MOS transistor, and has a gate, a drain, and a source. The gate is supplied with the control signal CTL1. The drain is connected to a source of the transistor P111. The source is supplied with the power source voltage VDD. Then, by making the control signal CTL1 a low level voltage, the transistor P117 is turned on to allow the transistor P111 to be selected. The same applies to other transistors P112, P113, and N121 to N123.

The load section 122B is provided, in the load section 122 according to the above-described embodiment, a plurality of transistors N130 (three transistors N131 to N133) that are configured to be selectable by a control signal CTL3. Similarly, the load section 122B is provided with a plurality of transistors P140 (three transistors P141 to P143) that are configured to be selectable by a control signal CTL4. Specifically, the load section 122B includes, for example, a transistor P137 that allows the transistor N131 to be selected. The transistor P137 is a P-type MOS transistor, and has a gate, a drain, and a source. The gate is supplied with the control signal CTL3. The drain is connected to a drain of the transistor N131 through a resistor R137. The source is supplied with the power source voltage VDD. Then, by making the control signal CTL3 a low level voltage, the transistor P137 is turned on to allow the transistor N131 and the resistor R137 to be selected as a load of the CMOS amplifier 121B. The same applies to other transistors N132, N133, and P141 to P143, and R147 to R149.

The capacitance attenuator 123B is provided, in the capacitance attenuator 123 according to the above-described embodiment, with a plurality of capacitors C120 (three capacitors C121 to C123 in this example) that are configured to be selectable by a control signal CTL5. Specifically, the capacitance attenuator 123B includes, for example, a transistor N117 that allows the capacitor C121 to be selected. The transistor N117 is an N-type transistor, and has a gate, a drain, and a source. The gate is supplied with the control signal CTL5. The drain is connected to another end of the capacitor C121. The source is supplied with the power source voltage VSS. Then, by making the control signal CTL5 a high level voltage, the transistor N117 is turned on to allow the capacitor C121 to be selected. The same applies to other capacitors C122 and C123.

Here, the transistor P117 and so on correspond to specific examples of a "first switch" in the present disclosure. The transistor N127 and so on correspond to specific examples of a "second switch" in of the present disclosure. The transistor P137 and so on correspond to specific examples of a "third switch" in the present disclosure. The transistor N147 and so on correspond to specific examples of a "fourth switch" in the present disclosure. The transistor N117 and so on correspond to specific examples of a "fifth switch" in the present disclosure. The resistor R137 and so on correspond to specific examples of a "second resistor" in the present disclosure. The resistor R147 and so on correspond to specific examples of a "third resistor" in the present disclosure.

With this configuration, the balun 110B allows the gain G1 of the CMOS amplifier 121B to be adjusted by the control signals CTL1 and CTL2, and allows, for example, a distortion characteristic to be adjusted by the control signals CTL3 and CTL4, and allows the differential property to be adjusted by the control signal CTL5.

Figure 26:
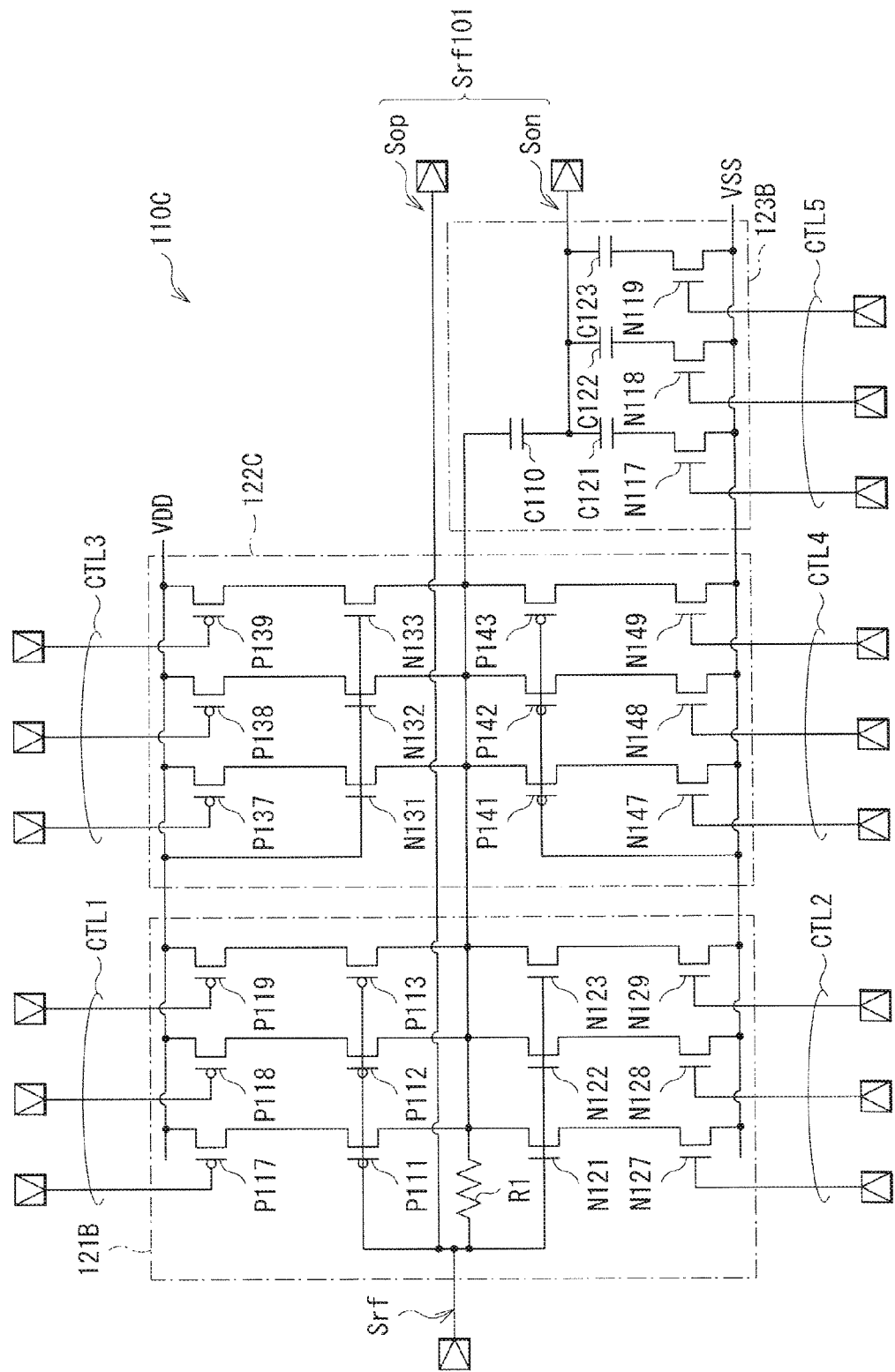
FIG. 26 is a block diagram illustrating one configuration example of a balun according to another modification example of the second embodiment.
Figure 27:
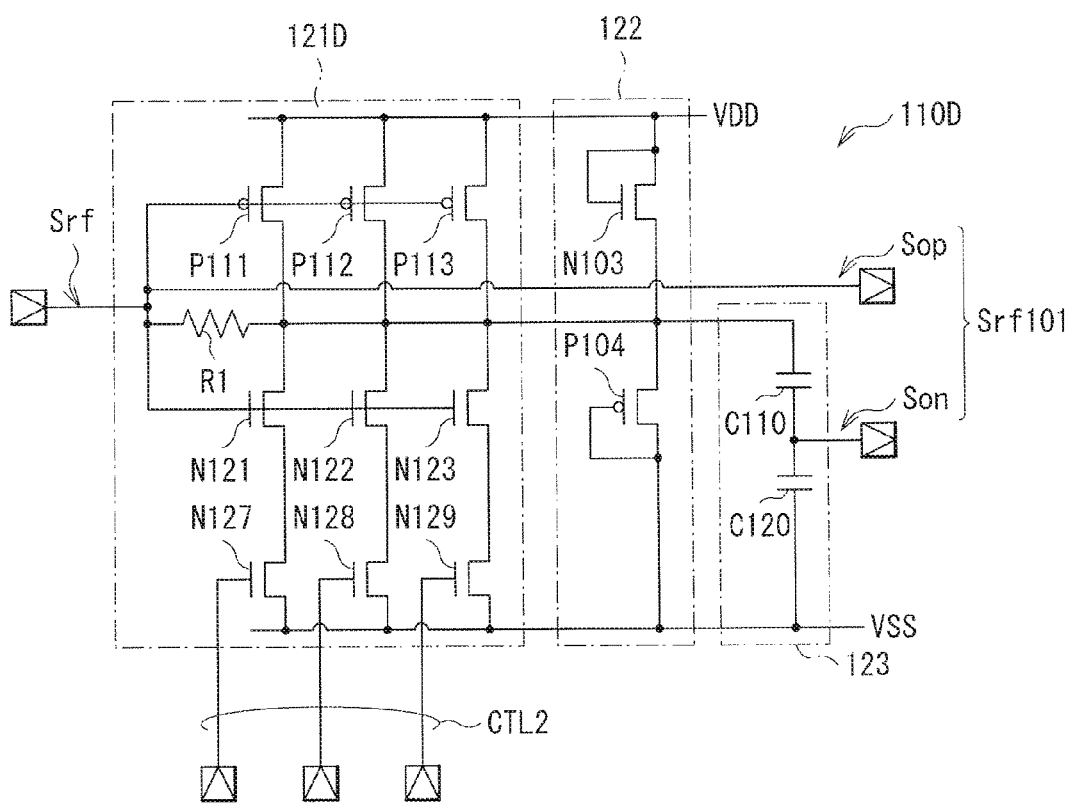
FIG. 27 is a block diagram illustrating one configuration example of a balun according to another modification example of the second embodiment.

It is to be noted that the present modification example is not limited to the configuration illustrated in FIG. 25. For example, in the balun 110 illustrated in FIG. 21, only the CMOS amplifier 121 may be substituted by the CMOS amplifier 121B (FIG. 25). Alternatively, only the load section 122 may be substituted by the load section 122B (FIG. 25). Alternatively, only the capacitance attenuator 123 may be substituted by the capacitance attenuator 123B (FIG. 25). Moreover, the load section 122B is provided with the resistors R137 to R139 and R147 to R149, but this is not limitative. Alternatively, as illustrated in FIG. 26, the resistors R137 and so on may be omitted, and the drain of the transistor N131 and the drain of the transistor P137 may be directly connected. Alternatively, in the CMOS amplifier 121B, as illustrated in FIG. 27, only the plurality of transistors N120 (the three transistors N121 to N123) may be configured to be selectable. Instead, only the plurality of transistors P110 (the three transistors P111 to P113) may be configured to be selectable.

Modification Example 2-2

Figure 28:
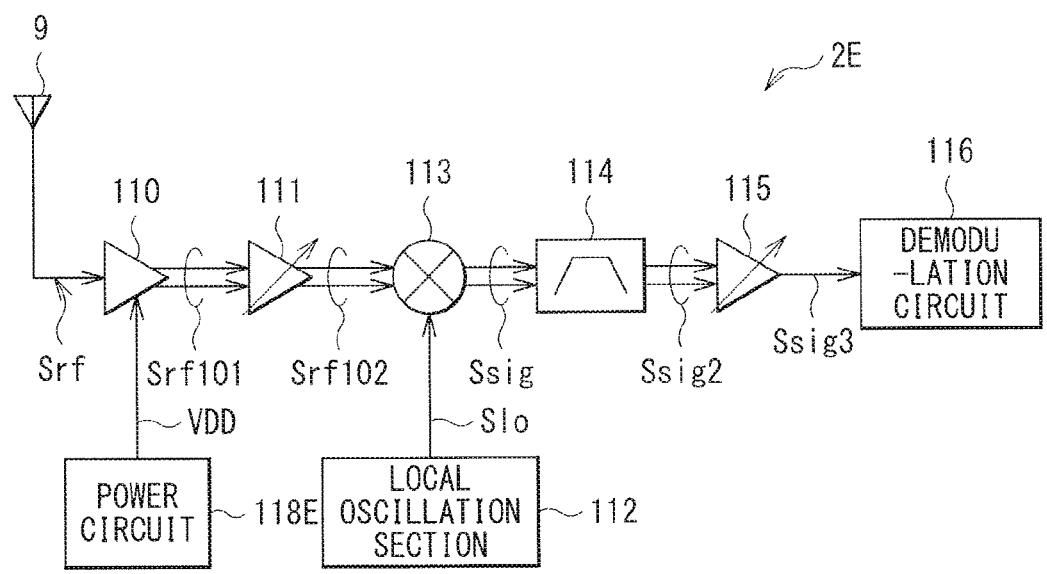
FIG. 28 is a block diagram illustrating one configuration example of a receiver according to another modification example of the second embodiment.

In the above-described embodiment, the balun 110 is configured to be supplied with power by a different power source from those of other circuit blocks. More specifically, for example, as illustrated in FIG. 28, a power circuit 118E that is configured to supply power to the balun 110 may be provided.

Modification Example 2-3

Moreover, in the above-described embodiment, the receiver 2 is configured to perform a receiving operation constantly, but this is not limitative. For example, the receiver 2 may be configured to suspend the receiving operation in a no-signal state and to perform the receiving operation intermittently. The details is as follows.

Figure 29:
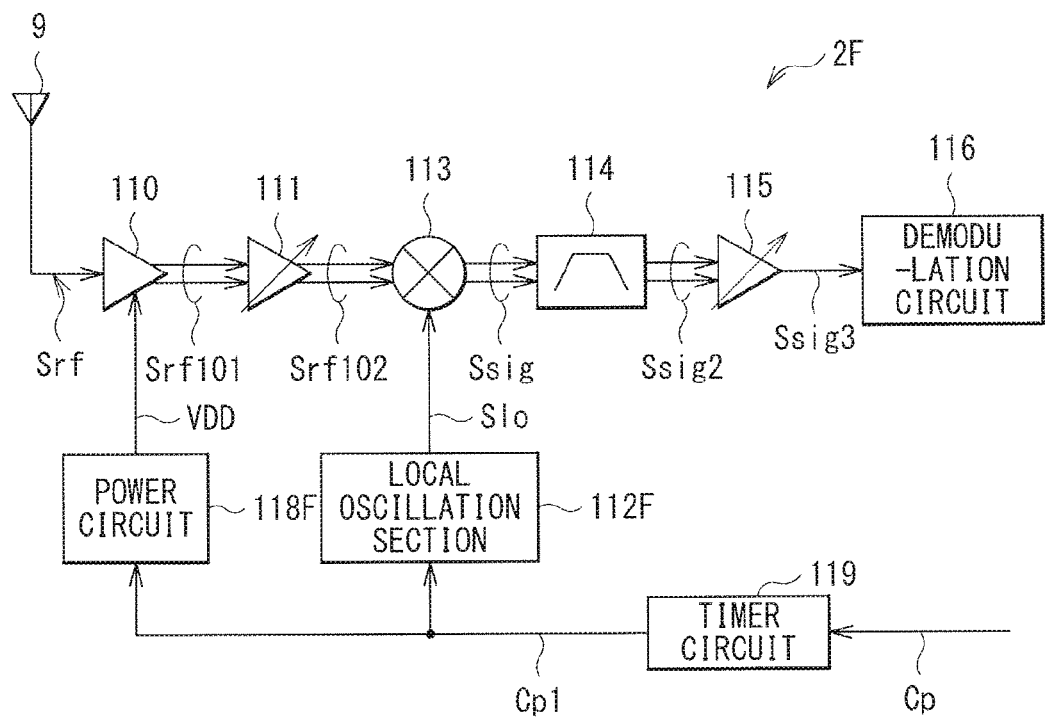
FIG. 29 is a block diagram illustrating one configuration example of a receiver according to another modification example of the second embodiment.

FIG. 29 illustrates one configuration example of a receiver 2F according to the present modification example. The receiver 2F includes a timer circuit 119, a local oscillation section 112F, and a power circuit 118F. The timer circuit 119 is configured to generate a control signal Cp1 that controls an intermittent operation of the receiver 2F based on a control signal Cp supplied from a controller (not illustrated) of the receiver 2F. The control signal Cp is a logic signal that becomes a high level at the no-signal state. The local oscillation section 112F is configured to generate the signal Slo or to suspend the generation based on the control signal Cp1. The power circuit 118F is configured to supply power to the balun 110 based on the control signal Cp1.

Figure 30:
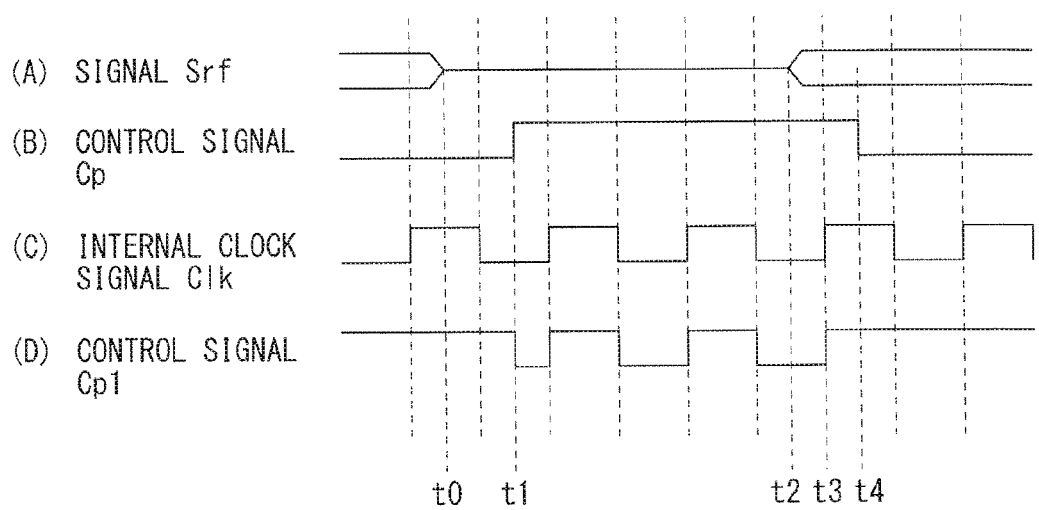
FIG. 30 is a timing waveform chart illustrating one operational example of the receiver illustrated in FIG. 29.

FIG. 30 illustrates a timing waveform of the receiver 2F, where (A) indicates the signal Srf, (B) indicates a waveform of the control signal Cp, (C) indicates a waveform of an internal clock signal Clk of the timer circuit 119, and (D) indicates a waveform of the control signal Cp1.

First, at a timing t0, the supply of the signal Srf from the antenna 9 is suspended, and the receiver 2F becomes the no-signal state ((A) of FIG. 30). The controller of the receiver 2F detects, based on a demodulation result of the demodulation circuit 116, the no-signal state, and allows, at a timing t1, the control signal Cp to change from a low level to a high level ((B) of FIG. 30). The timer circuit 119 outputs, in a period when the control signal Cp is at a high level (a period from the timing t1 to a timing t2), the internal clock signal Clk as the control signal Cp1 ((C) and (D) of FIG. 30). The local oscillation section 112F generates the signal Slo in a period when the control signal Cp1 is at a high level, and suspends the generation of the signal Slo in a period when the control signal Cp1 is at a low level. The power circuit 118F supplies power to the balun 110 in a period when the control signal Cp1 is at a high level, and suspends the power supply in a period when the control signal Cp1 is at a low level. In this way, the receiver 2F performs the receiving operation intermittently.

Then, at the timing t2, the supply of the signal Srf from the antenna 9 is restarted. After that, the receiver 2F performs the receiving operation based on the signal Srf, in a period when the control signal Cp1 is at a high level (a period from a timing t3 to a timing t4). The controller of the receiver 2F detects, based on a demodulation result of the demodulation circuit 116, the restart of the supply of the signal Srf, and allows the control signal Cp to change from a high level to a low level at the timing t4.

As described above, by performing the receiving operation intermittently in the no-signal state, it is possible to reduce power consumption of the receiver 2F.

Modification Example 2-4

Figure 31:
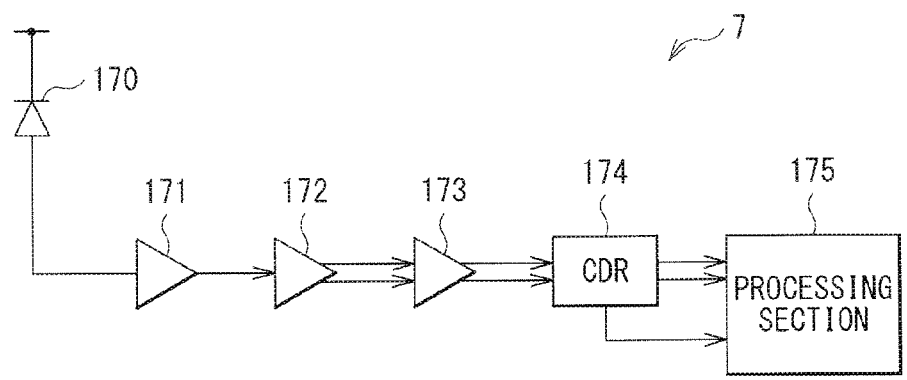
FIG. 31 is a block diagram illustrating one configuration example of a receiver according to one modification example of the second embodiment.

In the above-described example embodiment, the balun 110 is applied to a receiver of wireless communication, but this is not limitative. Alternatively, as illustrated in FIG. 31, examples of possible applications may include a receiver 7 in wired communication using optical fibers and so on. The receiver 7 includes a photo detector 70, TIA (trans impedance amplifier) 71, a single phase differential conversion circuit 72, an amplifier 73, and a CDR (clock and data recovery) 74 and a processing section 75. The photo detector 70 is configured to detect an optical signal supplied by an optical fiber or the like and to convert the optical signal to a current signal. The TIA 71 is configured to convert the current signal to a voltage signal. The single phase differential conversion circuit 72 is configured to convert the single phase voltage signal supplied from the TIA 71 to a differential signal, to which, for example, the balun 70 according to the above-described embodiment may be applied. The amplifier 73 is configured to amplify the supplied voltage signal. The CDR 74 is configured to generate a clock signal based on the voltage signal amplified by the amplifier 73, and to generate a data signal. The processing section 75 performs predetermined processing based on the clock signal and the data signal that are supplied from the CDR 74.

Modification Example 2-5

In the above-described example embodiment, the balun 110 is applied to a receiver, but this is not limitative. Alternatively, examples of possible applications may include a transmitter.

3. Third Embodiment

Next, description will be given on a receiver 3 according to a third embodiment. The present embodiment involves a receiver that is configured using both the attenuator 20 (the RF switch 30) according to the first embodiment and the balun 110 according to the second embodiment.

Figure 32:
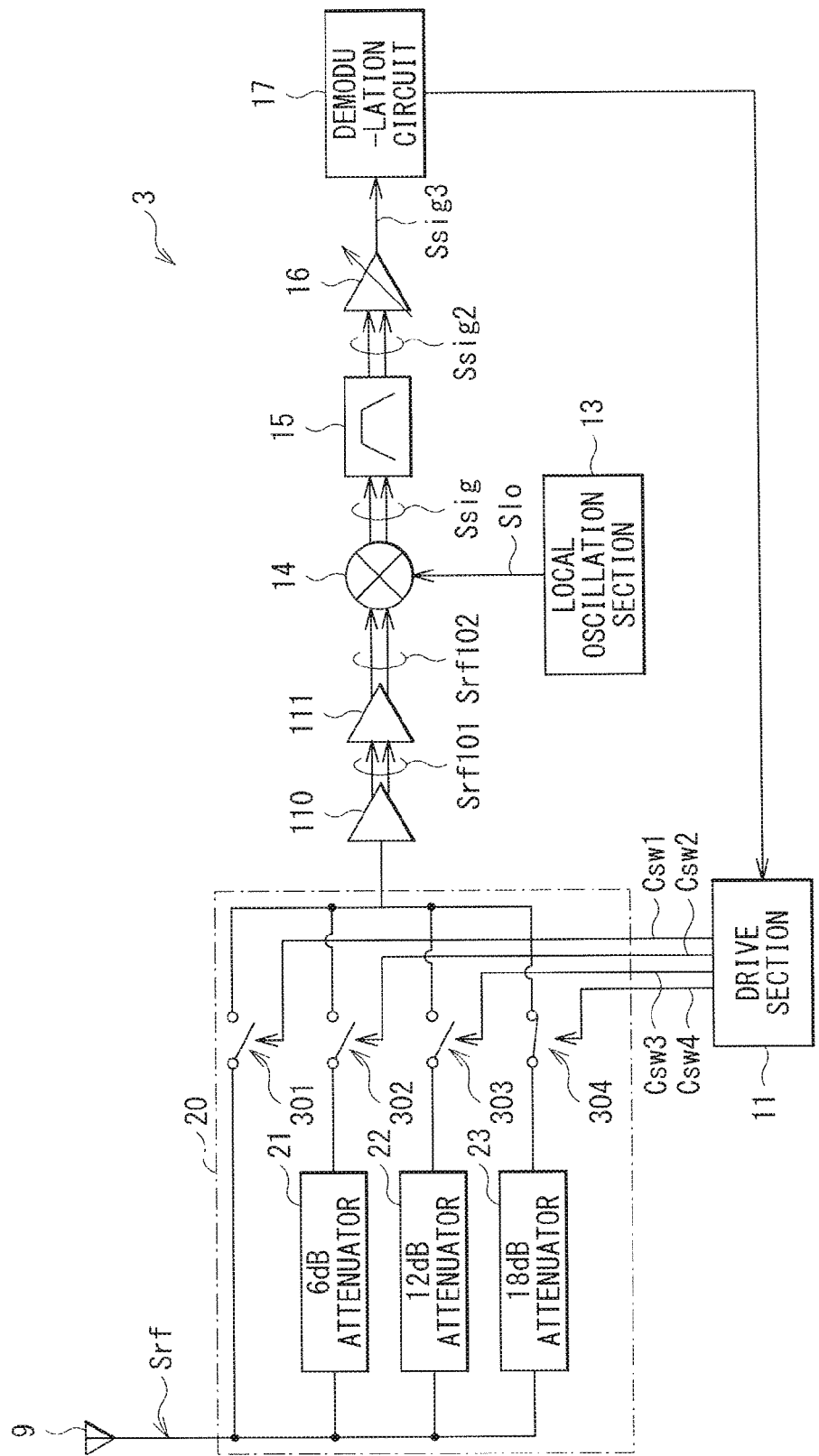
FIG. 32 is a block diagram illustrating one configuration example of a receiver according to a third embodiment of the present disclosure.

FIG. 32 illustrates one configuration example of the receiver 3 according to the third embodiment. The receiver 3 includes the attenuator 20, the drive section 11, the balun 110, and the RF amplifier 111. In other words, the receiver 3 has a configuration in which, in the receiver 1 (FIG. 1) according to the first embodiment, the low noise amplification circuit 12 is substituted by the balun 110 and the RF amplifier 111 (FIG. 20) according to the second embodiment.

Thus, since the present embodiment involves a combination of the attenuator according to the first embodiment and the balun according to the second embodiment, it is possible to obtain effects similar to the respective embodiments.

Modification Example 3-1

The above-described embodiment involves the combination of the attenuator 20 (the RF switch 30) according to the first embodiment and the balun 110 according to the second embodiment, but this is not limitative. Alternatively, for example, the modification examples 1-1 to 1-5 of the first embodiment or the modification examples 2-1 to 2-5 may be applied to this configuration.

4. Application Example

In the following, an application example of any of the receivers described in the above-mentioned embodiments and modification examples will be described.

Figure 33:
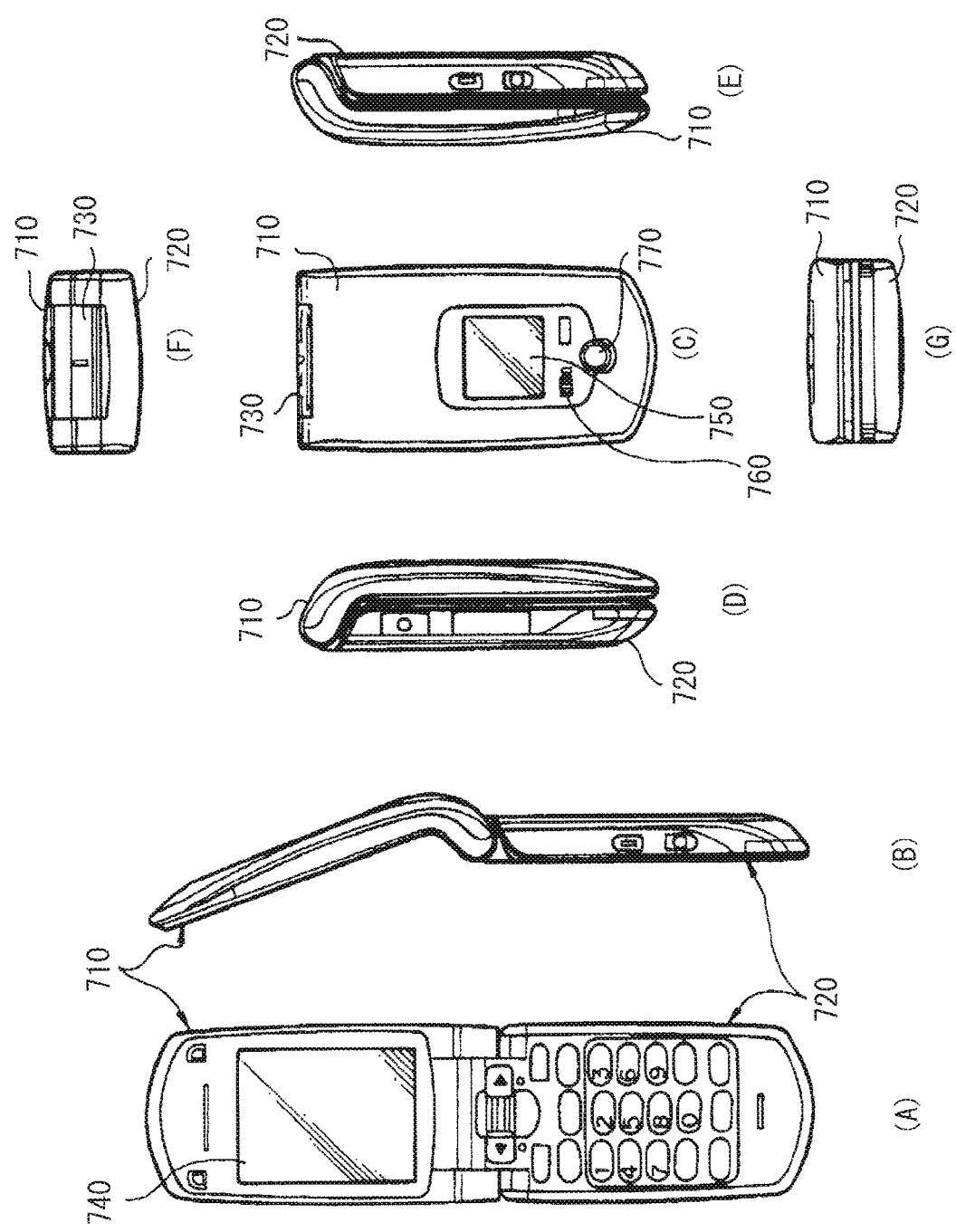
FIG. 33 is a front view, a side view, a top view, and a bottom view illustrating an appearance and a configuration of a mobile phone to which the receiver according to the example embodiments has been applied.

FIG. 33 illustrates an appearance of a mobile phone to which any of the receivers described in the above-mentioned embodiments and so on is applied. The mobile phone has a configuration in which, for example, an upper casing 710 and a lower casing 720 is linked by a link section (a hinge section) 730, and includes a display 740, a sub-display 750, a picture light 760 and a camera 770. The mobile phone is incorporated with any of the receivers according to the above-described embodiments and so on.

The receiver in the above-described embodiments and so on may be applied to, as well as such a mobile phone, an electronic apparatus in various fields such as a notebook personal computer, a portable game machine, a digital camera that have a communication function. In other words, the receiver in the above-described embodiments and so on may be applied to an electronic apparatus in various fields that has a communication function.

It is to be noted that the present technology may have the following configurations.

(1) A single phase differential conversion circuit including:

one or more first transistors of a first conductivity type each including a gate, a source, and a drain, the gate being connected to an input terminal, the source being configured to be connected to a first voltage source, the drain being connected to an output node;

one or more second transistors of a second conductivity type each including a gate, a source, and a drain, the gate being connected to the input terminal, the source being configured to be connected to a second voltage source, the drain being connected to the output node;

a first resistor that is inserted and connected between the input terminal and the output node;

a first output terminal that is connected to the input terminal; and a second output terminal that is directly or indirectly connected to the output node.

(2) The single phase differential conversion circuit according to (1), further including:

one or more third transistors of the second conductivity type each including a gate and a source, the gate being configured to be connected to the first voltage source, the source being configured to be connected to the output node;

one or more fourth transistors of the first conductivity type each including a gate and a source, the gate being configured to be connected to the second voltage source, the source being configured to be connected to the output node.

(3) The single phase differential conversion circuit according to (2), wherein a sum of transconductance of the one or more first transistors and transconductance of the one or more second transistors is larger than a sum of transconductance of the one or more third transistors and transconductance of the one or more fourth transistors.

(4) The single phase differential conversion circuit according to (2) or (3), wherein the first to fourth transistors are equal in channel length to one another, a channel width of the one or more first transistors is larger than a channel width of the one or more fourth transistors, and a channel width of the one or more second transistors is larger than a channel width of the one or more third transistors.

(5) The single phase differential conversion circuit according to any one of (2) to (4), wherein the one or more third transistors each further include a drain that is configured to be connected to the first voltage source, and the one or more fourth transistors each further include a drain that is configured to be connected to the second voltage source.

(6) The single phase differential conversion circuit according to any one of (2) to (4), further including:

one or more second resistors that are provided in correspondence with the one or more third transistors and each include a first terminal and a second terminal, the second terminal being configured to be connected to the first voltage source; and one or more third resistors that are provided in correspondence with the one or more fourth transistors and each include a first terminal and a second terminal, the second terminal being configured to be connected to the second voltage source, wherein the one or more third transistors each further include a drain that is connected to the first terminal of the respectively corresponding second resistor, and the one or more fourth transistors each further include a drain that is connected to the first terminal of the respectively corresponding third resistor.

(7) The single phase differential conversion circuit according to any one of (1) to (6), further including an attenuation section that is inserted and connected between the output node and the second output terminal.

(8) The single phase differential conversion circuit according to (7), wherein the attenuation section includes a first capacitor including a first terminal and a second terminal, the first terminal being connected to the output node, the second terminal being connected to the second output terminal; and one or more second capacitors each including a first terminal and a second terminal, the first terminal being connected to the second output terminal, the second terminal being configured to be connected to the second voltage source.

(9) The single phase differential conversion circuit according to any one of (1) to (8), further including:

one or more first switches that are provided in correspondence with the one or more first transistors and each include a first terminal and a second terminal, the first terminal being connected to the first voltage source, the second terminal being connected to the source of the respectively corresponding first transistor; and one or more second switches that are provided in correspondence with the one or more second transistors and each include a first terminal and a second terminal, the first terminal being connected to the second voltage source, the second terminal being connected to the source of the respectively corresponding second transistor.

(10) The single phase differential conversion circuit according to (5), further including:

one or more third switches that are provided in correspondence with the one or more third transistors and each include a first terminal and a second terminal, the first terminal being connected to the first voltage source, the second terminal being connected to the drain of the respectively corresponding third transistor; and one or more fourth switches that are provided in correspondence with the one or more fourth transistors and each include a first terminal and a second terminal, the first terminal being connected to the second voltage source, the second terminal being connected to the drain of the respectively corresponding fourth transistor.

(11) The single phase differential conversion circuit according to (6), further including:

one or more third switches that are provided in correspondence with the one or more second resistors and each include a first terminal and a second terminal, the first terminal being connected to the first voltage source, the second terminal being connected to the second terminal of the respectively corresponding second resistor; and one or more fourth switches that are provided in correspondence with the one or more third resistors and each include a first terminal and a second terminal, the first terminal being connected to the second voltage source, the second terminal being connected to the second terminal of the respectively corresponding third resistor.

(12) The single phase differential conversion circuit according to (8), including one or more fifth switches that are provided in correspondence with the one or more second capacitors and each include a first terminal and a second terminal, the first terminal being connected to the second voltage source, the second terminal being connected to the second terminal of the respectively corresponding second capacitor.

(13) A balun including:
one or more first transistors of a first conductivity type each including a gate, a source, and a drain, the gate being connected to an input terminal, the source being configured to be connected to a first voltage source, the drain being connected to an output node;
one or more second transistors of a second conductivity type each including a gate, a source, and a drain, the gate being connected to the input terminal, the source being configured to be connected to a second voltage source, the drain being connected to the output node;
a first resistor that is inserted and connected between the input terminal and the output node;
a first output terminal that is connected to the input terminal; and
a second output terminal that is directly or indirectly connected to the output node.

(14) A switch including:
one or more switching transistors each including a control terminal; and
a nonlinear circuit that is respectively connected to the control terminal.

(15) The switch according to (14),
wherein the one or more switching transistors include an N-type fifth transistor, and
impedance of the nonlinear circuit that is connected to the control terminal of the fifth transistor is lower as a voltage of the control terminal is higher.

(16) The switch according to (14) or (15),
wherein the one or more switching transistors include a P-type sixth transistor, and
impedance of the nonlinear circuit that is connected to the control terminal of the sixth transistor is higher as a voltage of the control terminal is lower.

(17) The switch according to any one of (14) to (16),
wherein the nonlinear circuit includes a seventh transistor.

(18) The switch according to (17),
wherein the seventh transistor includes a gate, a drain, and a source, and
one of the drain and the source, and the gate are connected to each other.

(19) The switch according to (18),
wherein the seventh transistor is a P-type transistor, and
the control terminal is connected to another of the drain and the source of the seventh transistor.

(20) The switch according to (18),
wherein the seventh transistor is an N-type transistor, and
the control terminal is connected to one of the drain and the source of the seventh transistor.

(21) The switch according to (19) or (20),
wherein the switching transistors each are configured to be turned on and off based on a voltage applied to a terminal, among the drain and the source of the seventh transistor, that is not connected to the control terminal.

(22) The switch according to any one of (14) to (21),
wherein the control terminal is a gate of the switching transistor.

(23) The switch according to any one of (14) to (21),
wherein the control terminal is a back gate of the switching transistor.

(24) The switch according to any one of (14) to (16),
wherein the nonlinear circuit includes a diode.

(25) The switch according to any one of (14) to (16),
wherein the nonlinear circuit includes a variable resistance circuit that is configured to allow a resistance value to be varied based on a voltage at the control terminal.

(26) A communication device including:
a single phase differential conversion circuit; and
a processing circuit that is configured to perform predetermined processing based on a differential signal generated by the single phase differential conversion circuit,
wherein the single phase differential conversion circuit includes
one or more first transistors of a first conductivity type each including a gate, a source, and a drain, the gate being connected to an input terminal, the source being configured to be connected to a first voltage source, the drain being connected to an output node,
one or more second transistors of a second conductivity type each including a gate, a source, and a drain, the gate being connected to the input terminal, the source being configured to be connected to a second voltage source, the drain being connected to the output node,
a first resistor that is inserted and connected between the input terminal and the output node,
a first output terminal that is connected to the input terminal, and
a second output terminal that is directly or indirectly connected to the output node.

(27) The communication device according to (26), wherein the single phase differential conversion circuit and the processing circuit are connected to different power sources from each other.

(28) The communication device according to (27), including a power circuit that is connected to the single phase differential conversion circuit.

(29) The communication device according to any one of (26) to (28),
wherein the communication device is a receiver, and
the input terminal is connected to an antenna.

(30) The communication device according to any one of (26) to (29),
wherein the communication device is a receiver, and
the processing circuit is configured to control the single phase differential conversion circuit, in a non-signal state, to allow the receiver to receive a signal intermittently.

(31) A communication device including:
one or more switches; and
a control section that is configured to control the one or more switches,
wherein the switch includes
one or more switching transistors each including a control terminal; and
a nonlinear circuit that is respectively connected to the control terminal.

(32) The communication device according to (31), including a plurality of switches,
wherein the switches each include a first terminal and a second terminal, and
the first terminal or the second terminal are connected to each other.

(33) A communication device including:
a switch section that is configured to switch a path of a single phase signal; and
a single phase differential conversion circuit that is configured to convert the single phase signal supplied from the switch section into a differential signal,
wherein the switch section includes
one or more switches, and
a control section that is configured to control the one or more switches,
the switch including
one or more switching transistors each including a control terminal, and a nonlinear circuit that is respectively connected to the control terminal, wherein the single phase differential conversion circuit includes one or more first transistors of a first conductivity type each including a gate, a source, and a drain, the gate being connected to an input terminal, the source being configured to be connected to a first voltage source, the drain being connected to an output node, one or more second transistors of a second conductivity type each including a gate, a source, and a drain, the gate being connected to the input terminal, the source being configured to be connected to a second voltage source, the drain being connected to the output node, a first resistor that is inserted and connected between the input terminal and the output node, a first output terminal that is connected to the input terminal, and a second output terminal that is directly or indirectly connected to the output node.

This application claims the benefit of Japanese Priority Patent Application JP 2012-120939 and JP 2012-120940 filed on May 28, 2012, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A balun, comprising:
    one or more first transistors of a first conductivity type each including a first gate, a first source, and a first drain, wherein the first gate is connected to an input terminal, the first source is connected to a first voltage source, and the first drain is connected to an output node;
    one or more second transistors of a second conductivity type each including a second gate, a second source, and a second drain, wherein the second gate is connected to the input terminal, the second source is connected to a second voltage source, and the second drain is connected to the output node;
    a first resistor directly connected between the input terminal and the output node, wherein the output node is configured to form a junction of the first drain of the one or more first transistors and the second drain of the one or more second transistors;
    a first output terminal connected to the input terminal; and
    a second output terminal directly or indirectly connected to the output node.

2. A switch configured to control a balun, the switch comprising:
    one or more switching transistors each including a control terminal, wherein the one or more switching transistors are configured to select at least one of one or more first transistors of a first conductivity type or one or more second transistors of a second conductivity type; and
    a nonlinear circuit configured to be respectively connected to the control terminal of each of the one or more switching transistors,
    wherein the balun comprises:
        the one or more first transistors each including a first gate, a first source, and a first drain, wherein the first gate is connected to an input terminal, the first source is connected to a first voltage source and the first drain is connected to an output node;
        the one or more second transistors each including a second gate, a second source, and a second drain, wherein the second gate is connected to the input terminal, the second source is connected to a second voltage source, and the second drain is connected to the output node;
        a first resistor connected between the input terminal and the output node, wherein the output node is configured to form a junction of the first drain of the one or more first transistors and the second drain of the one or more second transistors;
        a first output terminal connected to the input terminal; and
        a second output terminal directly or indirectly connected to the output node.

3. The switch according to claim 2,
wherein the one or more switching transistors include an N-type transistor, and
impedance of the nonlinear circuit decreases with an increase in a voltage of the control terminal.

4. The switch according to claim 2,
wherein the one or more switching transistors include a P-type transistor, and
impedance of the nonlinear circuit increases with an increase in a voltage of the control terminal.

5. The switch according to claim 2,
wherein the nonlinear circuit includes a transistor.

6. The switch according to claim 5,
wherein the transistor includes a gate, a drain, and a source, and
one of the drain, the source, or the gate are connected to each other.

7. The switch according to claim 6,
wherein the transistor is a P-type transistor, and
the control terminal is connected to another of the drain or the source of the transistor.

8. The switch according to claim 6,
wherein the transistor is an N-type transistor, and
the control terminal is connected to one of the drain or the source of the transistor.

9. The switch according to claim 7,
wherein each of the one or more switching transistors is configured to be turned on and off based on a voltage applied to a terminal, among the drain and the source of the transistor of the nonlinear circuit, that is disconnected from the control terminal.

10. The switch according to claim 2,
wherein the control terminal of each of the one or more switching transistors is a gate of the respective one or more switching transistors.

11. The switch according to claim 2,
wherein the control terminal of each of the one or more switching transistors is a back gate of the respective one or more switching transistors.

12. The switch according to claim 2,
wherein the nonlinear circuit includes a diode.

13. The switch according to claim 2,
wherein the nonlinear circuit includes a variable resistance circuit configured to vary a resistance value of the non-linear circuit based on a voltage at the control terminal.

* * * * *